United States Patent
Keyworth et al.

(10) Patent No.: US 8,368,983 B2
(45) Date of Patent: Feb. 5, 2013

(54) MEMS DEVICE WITH INDEPENDENT ROTATION IN TWO AXES OF ROTATION

(75) Inventors: Barrie Keyworth, Ottawa (CA); Kevin Kornelsen, Edmonton (CA); Jared Crawford, Edmonton (CA)

(73) Assignee: Micralyne, Inc., Edmonton, Alberta (CA)

( * ) Notice: Subject to any disclaimer, the term of this patent is extended or adjusted under 35 U.S.C. 154(b) by 169 days.

(21) Appl. No.: 12/828,050

(22) Filed: Jun. 30, 2010

(65) Prior Publication Data

US 2010/0265555 A1     Oct. 21, 2010

Related U.S. Application Data

(63) Continuation of application No. 12/432,607, filed on Apr. 29, 2009, now Pat. No. 8,208,192.

(60) Provisional application No. 61/048,724, filed on Apr. 29, 2008.

(51) Int. Cl.
   *G02B 26/08*        (2006.01)

(52) U.S. Cl. ............... 359/198.1; 359/199.2; 359/199.3; 359/224.1; 310/309

(58) Field of Classification Search .... 359/198.1–199.4, 359/200.6–200.8, 212.1–214.1, 224.1–224.2, 359/226.1–226.2, 290, 298; 310/36, 40 R, 310/40 MM, 309, 311
See application file for complete search history.

(56) References Cited

U.S. PATENT DOCUMENTS

| | | | |
|---|---|---|---|
| 6,532,318 B1 | 3/2003 | Brophy et al. | |
| 6,560,000 B2 | 5/2003 | Iyer et al. | |
| 6,760,501 B2 | 7/2004 | Iyer et al. | |
| 6,778,728 B2 | 8/2004 | Taylor et al. | |
| 6,859,300 B2 | 2/2005 | Greywall | |
| 6,934,439 B2 | 8/2005 | Mala et al. | |
| 6,956,697 B2 | 10/2005 | Wall et al. | |
| 6,958,850 B2 | 10/2005 | Sane et al. | |
| 6,968,101 B2 | 11/2005 | Miller et al. | |
| 6,985,271 B2 | 1/2006 | Yazdi et al. | |
| 7,010,188 B2 | 3/2006 | Miller et al. | |
| 7,014,326 B2 | 3/2006 | Danagher et al. | |
| 7,027,684 B2 | 4/2006 | Ducellier et al. | |
| 7,088,882 B2 | 8/2006 | Ducellier et al. | |
| 7,110,635 B2 | 9/2006 | Miller et al. | |
| 7,110,637 B2 | 9/2006 | Ma et al. | |
| 7,142,352 B2 | 11/2006 | Pardo et al. | |
| 7,159,461 B2 | 1/2007 | Gallon et al. | |
| 7,162,115 B2 | 1/2007 | Brophy et al. | |
| 7,167,613 B2 | 1/2007 | Miller et al. | |
| 7,187,485 B2 | 3/2007 | Bernstein et al. | |
| 7,203,413 B2 | 4/2007 | Ma et al. | |
| 7,209,274 B2 | 4/2007 | Van Drieenhuizen et al. | |
| 7,212,704 B2 | 5/2007 | Ducellier et al. | |
| 7,227,432 B2 * | 6/2007 | Lutz et al. | ..................... 333/186 |
| 7,236,660 B2 | 6/2007 | Ducellier et al. | |
| 7,242,511 B2 | 7/2007 | Ko et al. | |
| 7,302,131 B2 | 11/2007 | Ma et al. | |
| 7,302,132 B2 | 11/2007 | Miller et al. | |
| 7,302,134 B2 | 11/2007 | Ducellier | |

(Continued)

OTHER PUBLICATIONS

International Search Report, PCT/CA2009/000565, Jul. 27, 2009.

*Primary Examiner* — James Phan

(74) *Attorney, Agent, or Firm* — Senniger Powers LLP

(57) ABSTRACT

A MEMS arrangement is provided that has a top plane containing a rotatable element such as a mirror. There is a middle support frame plane, and a lower electrical substrate plane. The rotatable element is supported by a support frame formed in the middle support frame plane so as to be rotatable with respect to the frame in a first axis of rotation. The frame is mounted so as to be rotatable with respect to a second axis of rotation. Rotation in the first axis of rotation is substantially independent of rotation in the second axis of rotation.

22 Claims, 32 Drawing Sheets

U.S. PATENT DOCUMENTS

| | | |
|---|---|---|
| 7,321,704 B2 | 1/2008 | Ducellier et al. |
| 7,440,650 B2 | 10/2008 | Fondeur et al. |
| 7,952,778 B2 | 5/2011 | Moidu et al. |
| 2008/0151345 A1* | 6/2008 | Zhou .............................. 359/224 |

* cited by examiner

MEMS DEVICE WITH INDEPENDENT ROTATION IN TWO AXES OF ROTATION

RELATED APPLICATIONS

This application is a continuation of U.S. application Ser. No. 12/432,607 filed Apr. 29, 2009, now U.S. Pat. No. 8,208,192, which claims the benefit of U.S. Provisional Application No. 61/048,724 filed Apr. 29, 2008, hereby incorporated by reference in its entirety.

FIELD OF THE INVENTION

The invention relates to MEMS devices with rotation in two axes of rotation.

BACKGROUND OF THE INVENTION

The first generation of MEMS (micro-electromechanical systems) wavelength selective switches used single axis tiltable mirror arrays (one mirror per wavelength) to arbitrarily switch any set of optical wavelength signals incident at an input port to any of N output ports. A typical configuration was to disperse the wavelengths in a first axis (y) and switch in the orthogonal axis (x). Optimizing wavelength channel shape requires a tight beam waist in the y-axis at the MEMS mirror plane, while optimizing the number of achievable ports within a limited MEMS tilt range leads to a large beam waist in the x-axis. It is therefore advantageous to have a mirror array with an x-axis dimension significantly larger than y-axis dimension.

In order to achieve "hitless switching" (i.e. avoid scanning through intermediate ports), a 2-axis tilt is required for each mirror. A 2D gimbal arrangement that can fit within the footprint of the mirror can be used to produce an arrangement with a high fill factor. The 2D gimbal can be placed at the center of the mirror, with the disadvantage that the optical beam can not be centered on the mirror and does not fully utilize the available area. A hidden gimbal approach has been reported as a means to achieve the 2-axis tilt while maximizing the usable mirror area.

A significant challenge for both versions of 2D gimbals is that control of x and y axis tilt is not independent. This is due to coupling between drive electrodes as a result of shared electrostatic cavities. This coupling leads to a requirement for careful 2D calibration and control in order to follow the required "hitless" path trajectory. As a result, the switch path is broken into many smaller steps, at a cost to calibration time and to switching time.

SUMMARY OF THE INVENTION

Embodiments of the present invention substantially separate the two axes of tilt so that they can be controlled and optimized independently, while still achieving the desirable features of a high fill factor in at least one axis. In some embodiments, de-coupling of the x and y tilt drives allows control to be simplified and for the tilt around the elongated x-axis (i.e. roll) to be reduced to a binary 2-state operation. Since the mirror edge deflection when tilting around the x-axis is relatively small, and the moment of inertia is small compared to tilting around the y-axis, the drive characteristics for roll around the x-axis can be optimized to allow a relatively low drive voltage (<50 V).

Tilting around the y-axis (ie. piano tilt) produces a large deflection at the mirror tip and therefore may require larger clearances. The larger moment of inertia may also require stiffer hinges in order to avoid vibration and shock sensitivity. Electrostatic parallel plate actuation with high drive voltage and typically bi-directional actuation may be employed in order to address these issues. A stepped electrode provides some improvement.

According to one broad aspect, the invention provides a MEMS arrangement comprising: a top plane comprising a rotatable element; a middle support frame plane, a lower electrical substrate plane; wherein the rotatable element is supported by a support frame formed in the middle support frame plane so as to be rotatable with respect to the frame in a first axis of rotation; wherein the frame is mounted so as to be rotatable with respect to a second axis of rotation; wherein rotation in the first axis of rotation is substantially independent of rotation in the second axis of rotation.

According to another broad aspect, the invention provides the MEMS device comprising: a frame that supports a rotatable element so as to allow the rotatable element to rotate about a first axis of rotation; a first pair of interconnections that connect the frame to a pair of supports so as to allow the frame to rotate about a second axis of rotation; a first actuator for actuating rotation of the rotatable element in the first axis of rotation, a second actuator for actuating rotation of the frame in the second axis of rotation; the first actuator formed so as to rotate with the frame about the second axis of rotation.

According to another broad aspect, the invention provides an electrostatic actuator comprising: first and second vertical combs arranged to provide a comb drive, the first vertical comb connectable to a first voltage and the second vertical comb connectable to a second voltage; an electrostatic plate arrangement comprising a first plate and a second plate, the first plate connectable to the first voltage and the second plate connectable to the second voltage; wherein application of the first and second voltages actuates an attractive force between the combs that brings the combs closer together and in so doing brings the first plate and second plate closer together such that an attractive force between the first plate and the second plate brings the first plate and the second plate closer together.

According to another broad aspect, the invention provides a MEMS device comprising: an element to be rotated about an axis of rotation; the electrostatic actuator of claim 39 wherein: one of the first and second plates being formed to rotate with the element to be rotated, and the other of the first and second plates being in a static position; one of the first and second vertical combs being formed to rotate with the element to be rotated, and the other of the first and second vertical combs being in a static position.

DETAILED DESCRIPTION OF THE EMBODIMENTS

A disadvantage of conventional MEMS designs featuring x and y tilt is that high voltage drives are usually required for both axes and bi-directional tilt is often required to achieve enough tilt range around the y-axis, leading to three high voltage drives per mirror. Since high voltage drives require special attention due to increased probability of electrical breakdown/shorting, and high voltage drive electronics are significantly more expensive than their lower voltage counterparts, it is beneficial to minimize their use.

In addition, if a MEMS mirror forms part of a capacitive, parallel plate electrostatic actuator, then the force exerted on the mirror, and therefore the degree of actuation, is significantly impacted by any changes in the flatness of the mirror. Since material stresses can change over time and temperature, thereby affecting mirror flatness, it is advantageous to decouple the mirror surface from the electrostatic actuation—particularly for axes that are significantly elongated (where changes in flatness lead to larger changes in electrostatic gaps).

Figure 1A:
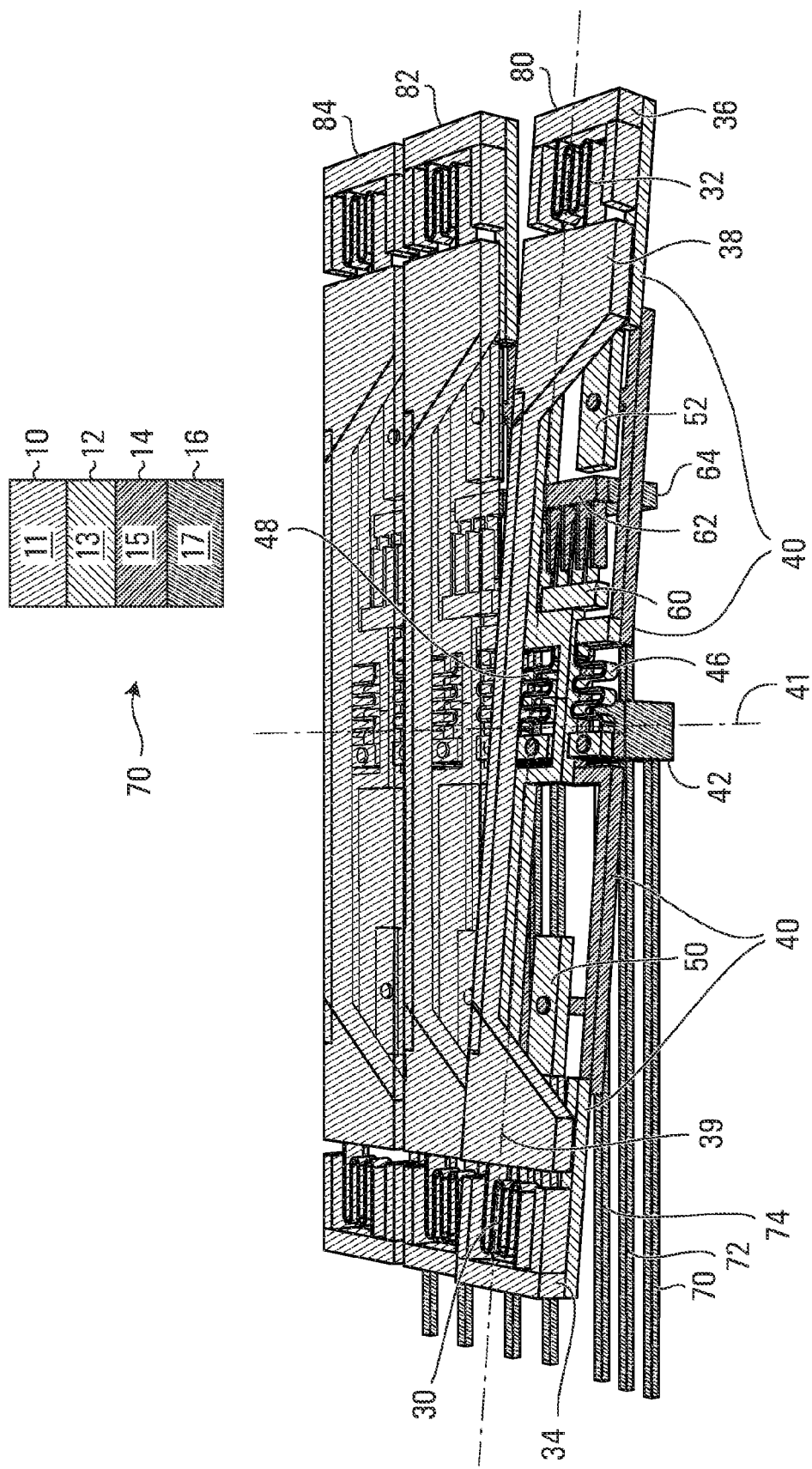
FIG. 1A is a perspective view of a MEMS arrangement provided by an embodiment of the invention.
Figure 1B:
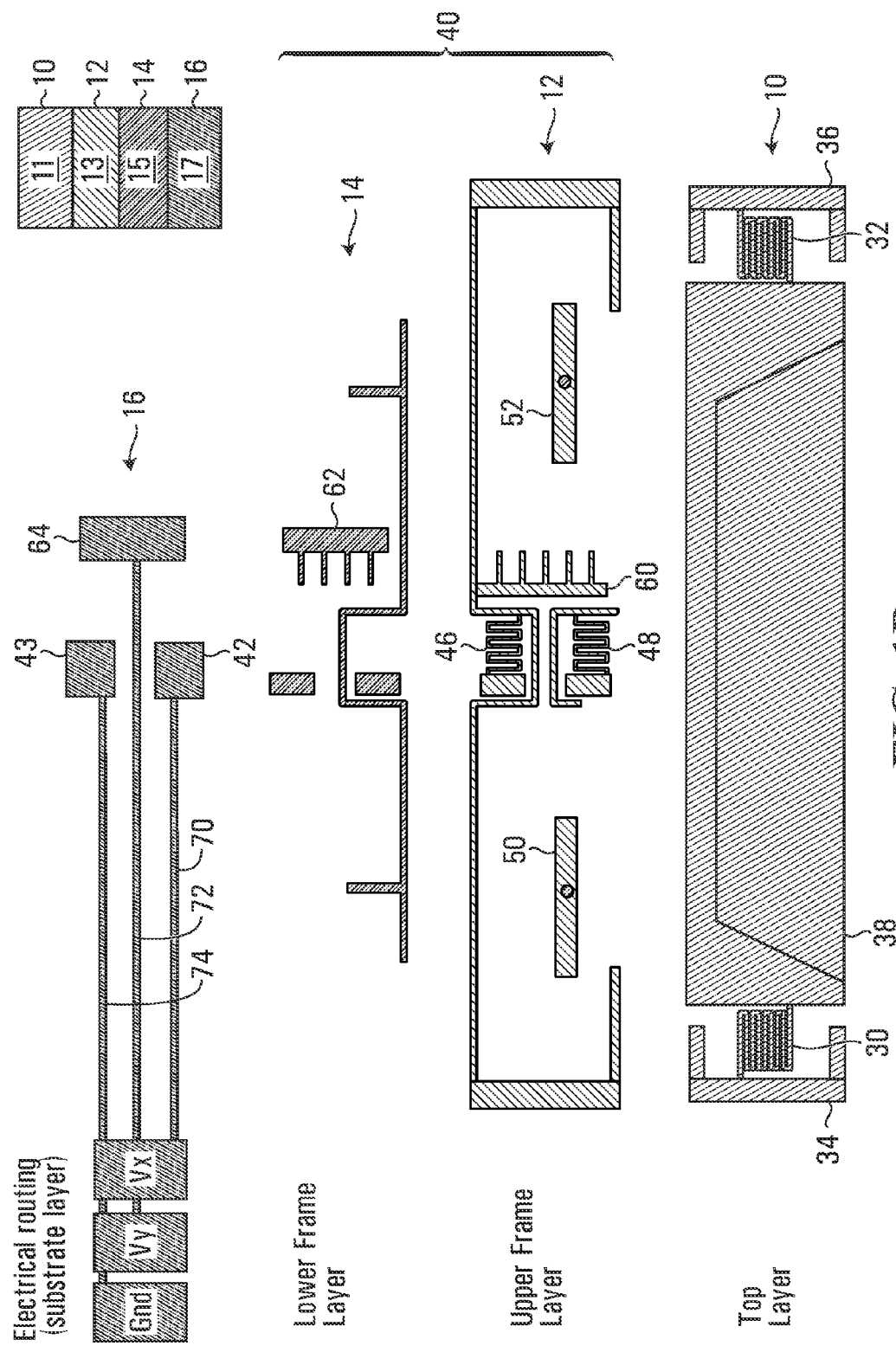
FIG. 1B is a plan view of layers of the MEMS arrangement of FIG. 1A.
Figure 2:
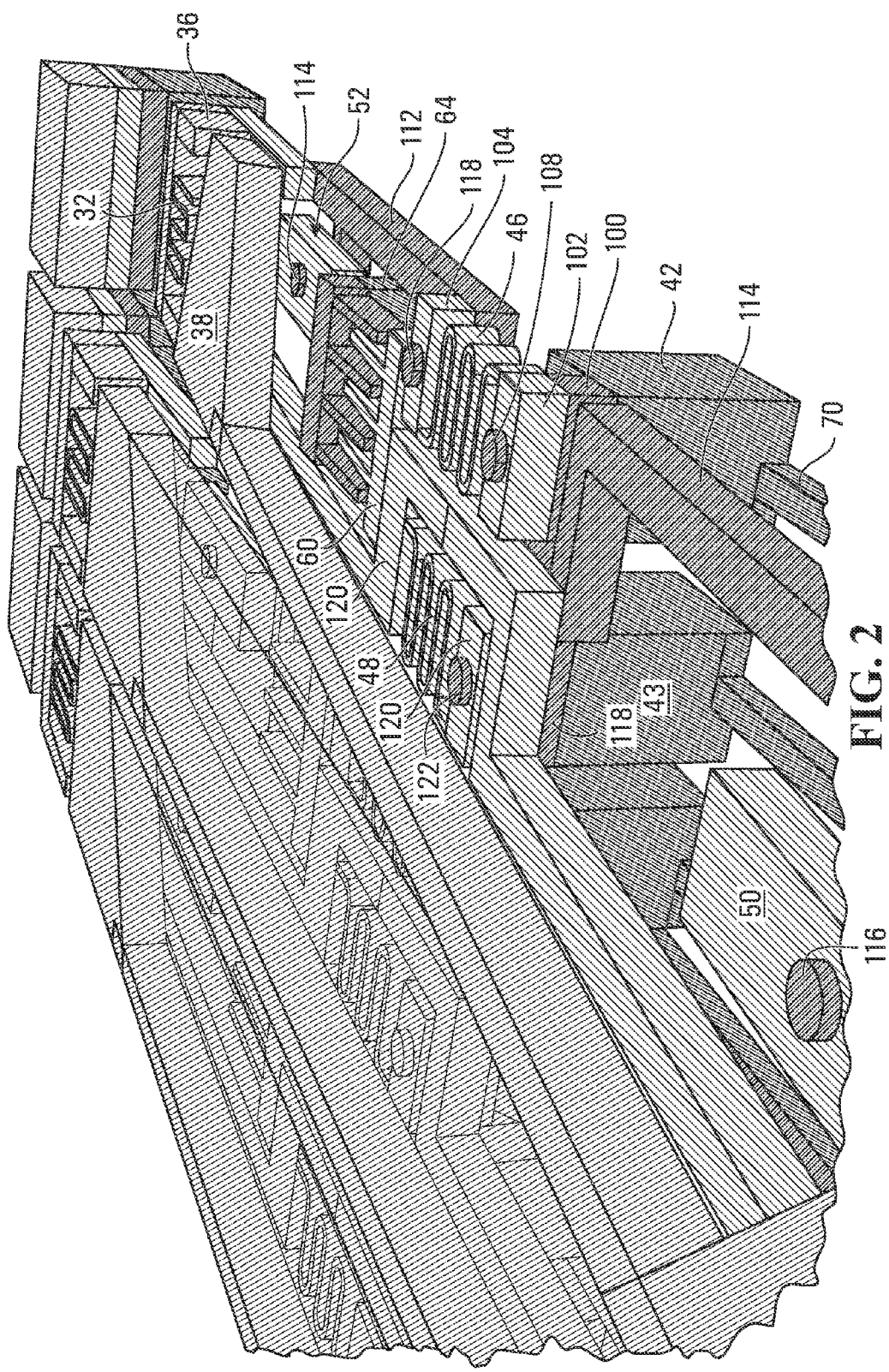
FIG. 2 is a more detailed partial cut-away perspective view of the MEMS arrangement of FIG. 1A.

Referring now to FIGS. 1A, 1B and 2 shown are perspective (FIGS. 1A and 2) and layer-by-layer (FIG. 1B) of a MEMS device with two dimensional rotation provided by an embodiment of the invention. In the particular example illustrated, the structure is used to provide a mirror that can be rotated independently in x and y axes of rotation; however, it is to be clearly understood that there may be other applications of this structure to rotate elements other than mirrors such as a thin-film interference filter, a reflective grating structure, or a resonant cavity etalon to name a few specific examples. FIG. 1A shows three such devices 80,82,84 arranged in a row from the top of the Figure to the bottom of the Figure; only the bottom device 80 of the three devices will be described in detail.

The MEMS device 80 is defined within a layered structure that includes a top layer 10, upper frame layer 12, lower frame layer 14 and bottom layer 16. FIG. 1B shows a plan view of an example implementation of the top layer 10, upper frame layer 12, lower frame layer 14, and bottom layer 16. A legend is indicated at 70 that shows how components forming part of each layer are illustrated. Specifically, components in the top layer 10 are indicated with hatching 11, components in the upper frame layer 12 are indicated with hatching 13, components in the lower frame layer 14 are indicated with hatching 15, and components in the bottom layer 16 are indicated with hatching 17.

In the top layer 10 there is defined a pair of hinges 30, 32, hinge anchors 34,36 and a mirror 38 shown partially cut away. The hinges 30,32 connect opposite ends of the mirror 38 to the hinge anchors 34,36. An axis of rotation 39 is defined by the hinges 30,32 and will be referred to as the x-axis, and as such hinges 30,32 will be referred to as "x-hinges". At the instant depicted in FIG. 1, the mirror 38 is shown in a slightly rotated state about the x-axis 39.

A frame generally indicated at 40 supports the components in the top layer 10. The frame 40 is defined partially in the upper frame layer 12 and partially in the lower frame layer 14. The frame 40 is supported by a pair of support blocks 42,43 (only support block 42 visible in the view of FIG. 1A; both blocks 42,43 are visible in FIG. 1B) formed in the bottom layer 10 through a pair of hinges 46,48 formed here in the upper frame layer 12 (or alternatively in the lower frame layer 14, or both upper frame layer 12 and lower frame layer 14) that allow the frame 40 to rotate about an axis of rotation 41 that will be referred to herein as the y-axis. As such, hinges 46,48 will be referred to as "y-hinges". A respective one of the y-hinges 46,48 connects the frame 40 to each of the pair of support blocks 42,43. At the instant depicted in FIG. 1, the frame 40 is shown in a slightly rotated state about the y-axis 41.

The hinge anchors 34,36 in the top layer 10 are supported by a portion of the frame 40 formed in the upper frame layer 12. The mirror 38 and optionally the x-hinges 30,32 are thinner than the rest of the components formed in the top layer 10 namely the hinge anchors 34,36 such that there is a gap, referred to herein as the "x-gap", between the mirror 38 and the upper frame layer 12; the x-gap provides space for the mirror 38 to rotate in the x-axis 39.

The frame 40 includes a first moveable y-tilt vertical comb 60. In the illustrated example, this is defined in the upper frame layer 12. The first moveable y-tilt vertical comb 60 moves with the frame 40 when the frame 40 rotates about the y-axis 41. A support 64 defined in the bottom layer 10 supports a second static y-tilt vertical comb 62. The second y-tilt vertical comb 62 is defined in the same layer used for the lower frame layer 12, but the second y-tilt vertical comb is not connected to the frame 40 and does not move with the frame; rather, the second y-tilt vertical comb 62 is statically connected to the support 64.

Also shown is a pair of x-tilt electrodes 50,52 defined in the upper frame layer 12. The x-tilt electrodes 50,52 are offset from the x-axis 39. As detailed below, the MEMS device 80 allows for an x-voltage to be applied to the pair of electrodes 50,52.

Three traces 70,72,74 deliver voltages to the device. Specifically, trace 70 delivers an x-voltage; trace 72 delivers a y-voltage; and trace 74 delivers a ground voltage. For the purpose of enabling control of rotation in the x-axis 39, there is a conductive path connecting the trace 70 delivering the x-voltage to the x-tilt electrodes 50,52, and there is a conductive path connecting the mirror 38 to ground trace 74. For the purpose of controlling rotation in the y-axis 41, there is a conductive path connecting the static y-tilt vertical comb 62 to the trace 72 delivering the y-voltage, and there is a conductive path connecting the movable y-tilt vertical comb 60 to the ground trace 74. These conductive paths will be described in further detail below.

In operation, the application of an x-voltage to the x-tilt electrodes 50,52 and the ground voltage to the mirror 38 results in a potential difference between the x-tilt electrodes and the mirror 38; the x-tilt electrodes 50,52 are offset from the x-axis 39 such that the resulting electrostatic attraction causes the mirror to rotate about the x-axis 39. When the x-voltage is returned to ground, the tension in the x-hinges 30,32 returns the mirror 38 to its default position in which there is no rotation about the x-axis 39.

Similarly, the application of a y-voltage to the static y-tilt vertical comb 62 and the ground voltage to the moveable y-tilt vertical comb 60 results in a potential difference between the y-tilt vertical combs 60,62. The resulting electrostatic attraction between the combs 60,62 causes the frame 40 to rotate about the y-axis 41. The mirror 38 is supported by the frame 40 and as such experiences the same rotation about the y-axis. When the y-voltage is returned to ground, the tension in the y-hinges 46,48 returns the frame 40 (and the mirror 38) to its default position in which there is no rotation about the y-axis 41. The height of the supports 42,43 defines a limit on the amount of rotation possible in the y-axis 41.

In the above described embodiment, the mirror 38 can roll (x-tilt) with respect to the support frame 40 containing drive combs 60,62, electro-static x-electrodes 50,52, y-tilt hinges 46,48, and the x-tilt hinges 30,32 can be formed in the same layer as the mirror at both ends of the mirror.

In some embodiments, the arrangement is implemented using a 3 layer stack. Each layer may include one or more sub-layers. The top-most layer is used for the mirror and x-hinges. The middle layer is used for the support frame and upper and lower part of the vertical comb drive, and the bottom-most layer is used for the supports and paths to deliver the voltages used to control the rotation.

In a specific example, the top-most layer is formed from SOI (silicon on insulator) which includes a removable handle wafer, a Silicon layer and an Oxide layer; the middle frame is formed from DSOI (double silicon on insulator) comprising a handle wafer and two Si layers and two Oxide layers. Doped silicon can be used for SOI and DSOI to provide electrical continuity without the need for metal traces. The oxide in DSOI provides an etch stop for Deep Reactive Ion Etching (DRIE) and electrical isolation between upper and lower halves of middle frame. Conductive vias can be used to provide electrical connection between frame layers where desired. The upper and lower frame layers can therefore operate together as a combined mechanical structure while allowing isolated electrical routing to desired locations. Detailed examples are given below.

With the design illustrated, the x-gap can be small since the mirror deflection is small during x-tilt. Advantageously, this allows for a relatively low voltage x-tilt drive compared to the voltage used to drive rotation in the y axis.

It can be seen that x and y tilt are substantially decoupled.

Rotation in the x-axis is achieved as a result of an attractive force between the x-electrodes formed in the frame layer, and the mirror layer which is connected to ground. This rotation in the x-axis is not effected by the state of y-rotation. This is because the distance between the mirror and the x-electrodes is not a function of the state of y-rotation due to the fact that the x-electrodes rotate with the frame along with the mirror when there is rotation in the y-axis.

Rotation in the y-axis is achieved as a result of an attractive force between the static drive comb in the lower frame layer and the movable comb in the upper frame layer. This rotation in the y-axis is not effected by the state of x-rotation. This is because the distance between the drive combs is not a function of the state of x-rotation. X-rotation only rotates the mirror; there is no rotation of the frame in the x-axis, and in turn, there is no rotation of the movable comb in the x-axis.

Wavelength selective switch applications are typically less sensitive to x-axis rotation, and as such the resulting device can be quite insensitive to vibration in x-roll. This means that the x-tilt hinges can be weaker than they might otherwise need to be and this in turn also lowers the voltage needed to actuate rotation in the x-axis.

The resulting wavelength selective switch device can also be quite insensitive to mirror flatness as described previously since changes in the mirror to frame separation along the long axis 39 do not impact y-tilt. Furthermore, flatness along the short axis 41, which would impact x-tilt, is less critical.

In some embodiments, the drive for x-tilt is implemented with two states, namely a binary ON state during which a predetermined x-voltage is applied, and binary OFF during which an x-voltage of zero (or any predetermined secondary voltage) is applied.

The following is a detailed set of example dimensions for the various layers. The actual dimensions would be implementation specific.

Top SOI Layer: The silicon layer of the upper most layer can for example be 10-20 microns thick, and is used to form the grounded mirror and x-tilt hinges. A gold reflector (or other highly reflective layer) is used to implement the mirror functionality. A backside etch is performed to form a 5-10 micron x-gap between the mirror and the top frame layer. The x-hinges may also be thinner than the hinge anchors.

DSOI layer-upper layer: the silicon top layer can for example be 10-15 microns thick and is used to form a grounded portion of the frame (and is connected to the mirror through x-tilt hinges), x-tilt electrode islands (Vx), moveable y-tilt vertical combs (connected to grounded portion of the frame), y-tilt hinges (one connected to ground, the other connected to x-voltage).

DSOI layer-lower layer: the silicon layer (approx 10-15 microns) is used to form the static y-tilt vertical combs, bridge sections to anchor the x-tilt electrode islands to the ground portion of the frame formed in the upper layer of the DSOI layer; electrical vias connect the first grounded y-hinge to upper ground frame and the second y-hinge conducting Vx to the x-tilt electrodes.

Bottom via substrate is used for through wafer vias, contact metal for Vy, Vx and Gnd, etched stand-offs (supports) to create clearance for y-tilt.

In some embodiments, the combination of stiff comb drive tilt, etched frame, and large stand-off clearance should effectively eliminate pneumatic effect which can cause transient coupling between adjacent mirrors.

Figure 3:
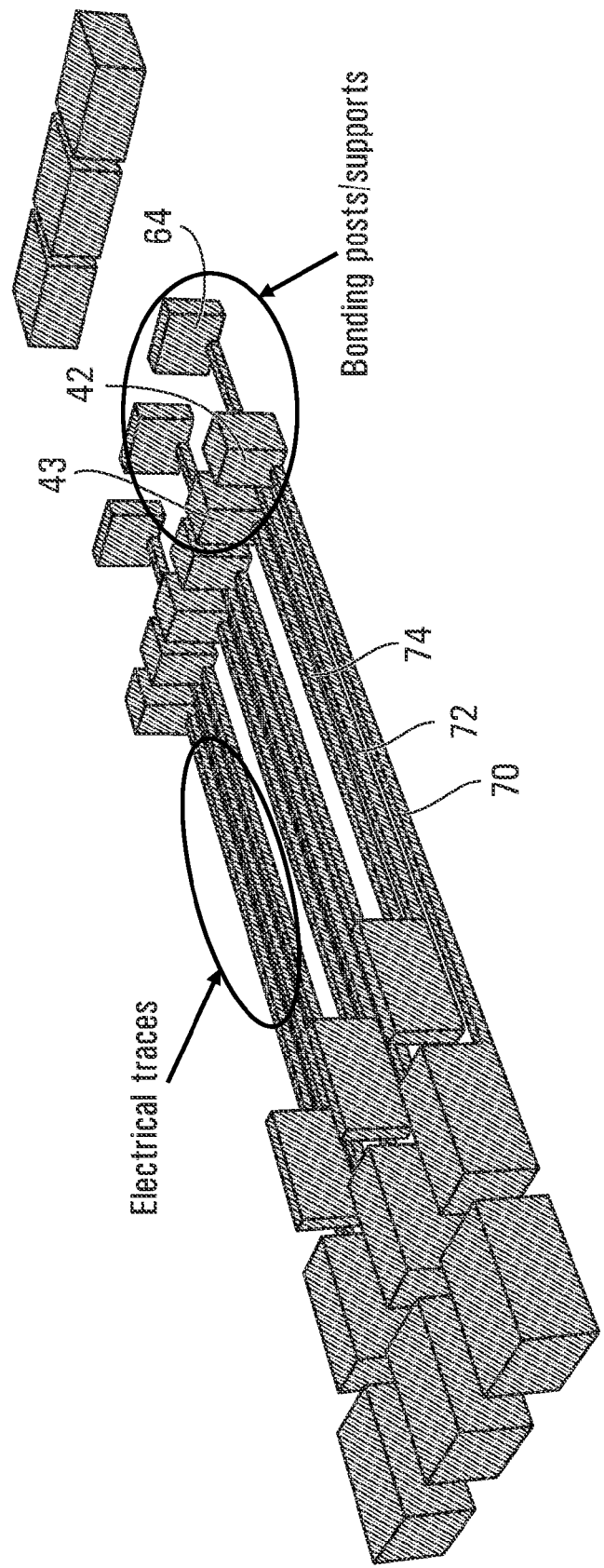
FIG. 3 is a perspective view of the base layer and bonding posts.

A detailed view of the electrical traces 70,72,74 and the supports 42,43,64 is shown in FIG. 3.

Figure 4:
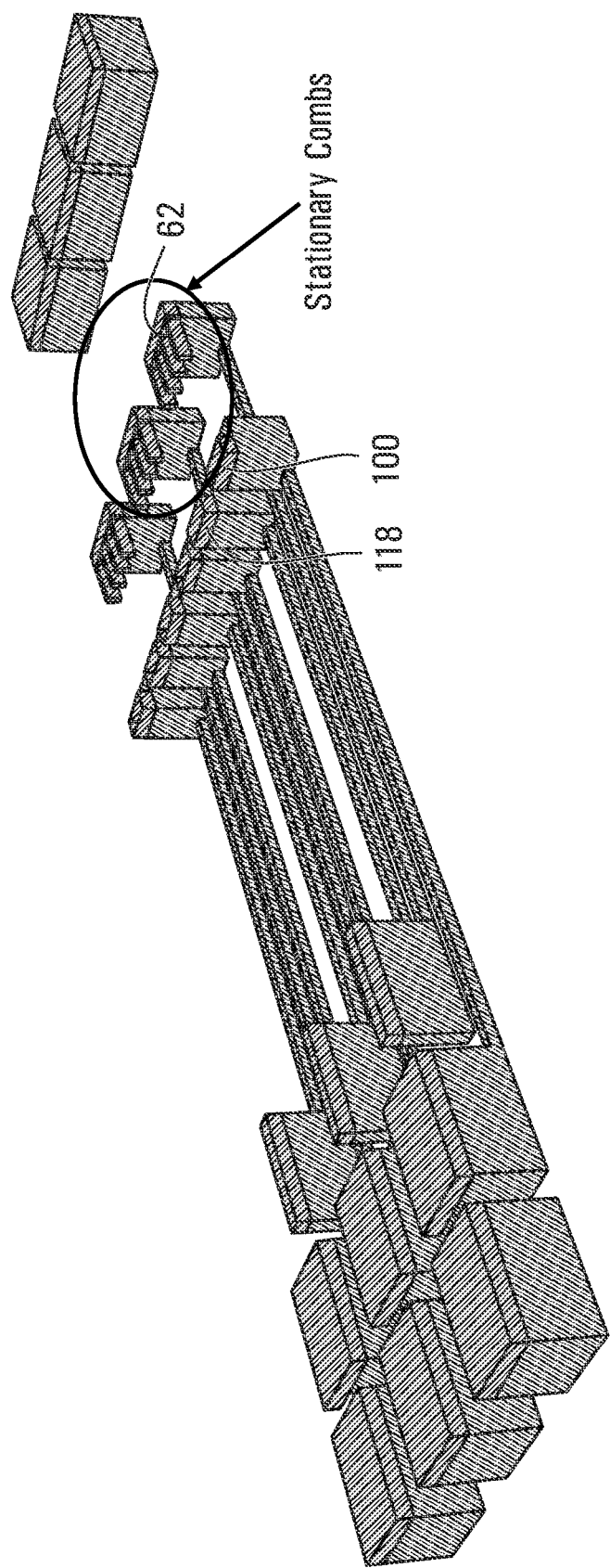
FIG. 4 is a perspective view of the base layer and bonding posts and stationary combs.

A detailed view of static y-tilt vertical comb 62 is shown in FIG. 4; this figure also shows sections 100,118 of the lower frame layer referred to below in the description of the delivery of the various voltages used to control the rotation.

Figure 5:
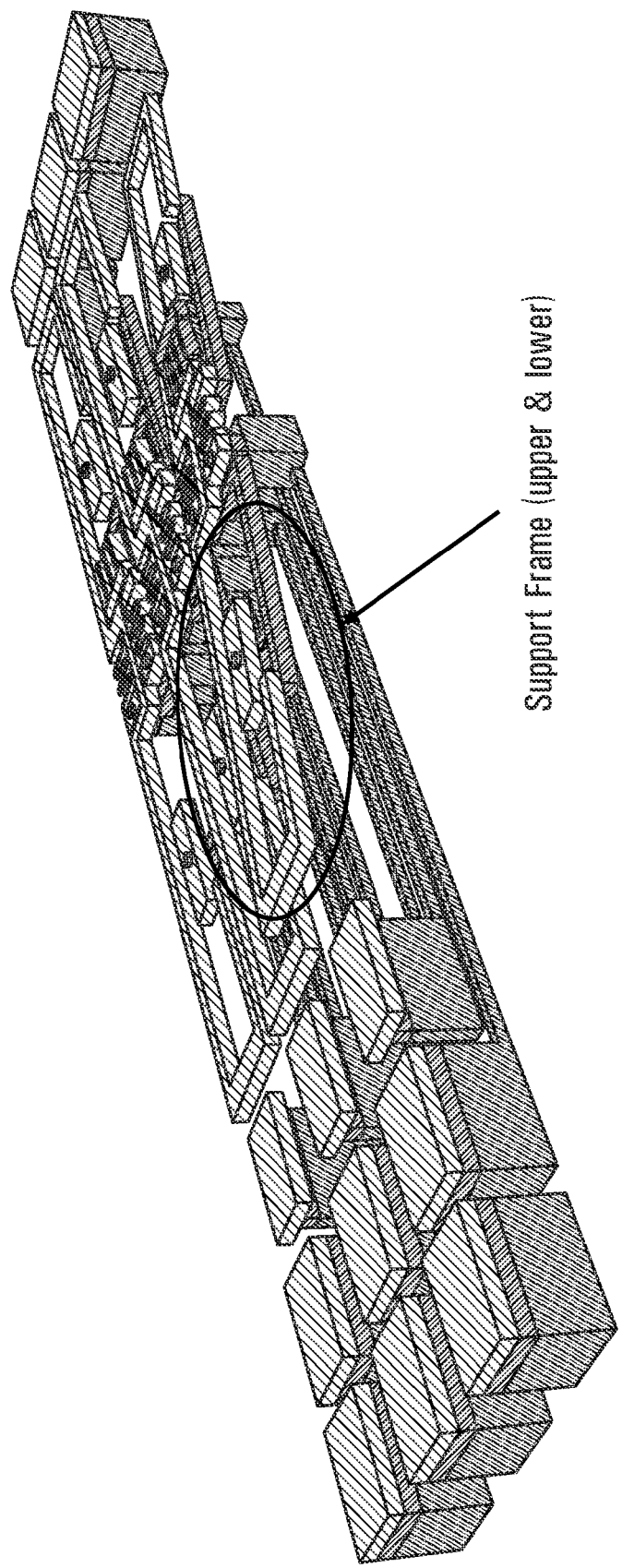
FIG. 5 is a perspective view of the base layer and bonding posts, stationary combs, and support frame.

A detailed view of the upper frame layer is shown in FIG. 5.

With reference to FIG. 2, the x-voltage is delivered to the x-tilt electrode 52 as follows:
1) x-voltage applied to trace 70;
2) conducts up support 42;
3) conducts up through isolated section 100 of lower frame layer;
4) conducts to section 102 of upper frame layer through via 108 that connects isolated section 100 of lower frame layer to section 102 of upper frame layer that would otherwise be electrically insulated due to oxide layer in between;
5) conducts through y-hinge 46;
6) conducts to section 104 of upper frame layer;
7) conducts to section 112 of lower frame layer through via 118 that connects section 104 of upper frame layer to section 112 of lower frame layer that would otherwise be electrically insulated;
8) conducts to x-electrode 52 through via 114 that connects the x-tilt electrode 52 to section 112 of lower frame layer.

The x-voltage is delivered to x-tilt electrode 50 as follows:
1) conducts to section 112 of lower frame layer as detailed above in the description of the delivery of the x-voltage to x-tilt electrode 52;
2) conducts around entire lower frame (not shown in FIG. 2 but can be seen in FIG. 1B) until it reaches section 114 of lower frame layer;
3) conducts to x-tilt electrode 50 through via 116 that connects the x-tilt electrode 50 to section 115 of the lower frame layer.

The ground voltage is delivered to the mirror 38 as follows:
1) ground applied to trace 74;
2) conduct up other support 43;
3) conduct to isolated section 118 of lower frame layer;
4) conduct to section 120 of upper frame layer through via 122 that connects isolated section 118 of the lower frame layer to section 120 of the upper frame layer;
5) conduct through y-hinge 48;
6) conduct through section 120 of upper frame; section 120 of frame supports hinge anchor 36;
7) conduct through hinge anchor 36;
8) conduct through x-hinge 32 to mirror 38.

Note the ground voltage also reaches the mirror through the other x-hinge 30 in a similar manner.

The y-voltage is delivered to the static y-tilt vertical comb 62 as follows:
1) y-voltage applied to trace 74; trace 74 is connected to support 64;
2) conducts through support 64 to static y-tilt vertical comb 62.

The ground voltage is delivered to the moveable y-tilt vertical comb 60 as follows:
1) ground voltage conducts to section 120 of upper frame layer as described above when describing the delivery of ground voltage to mirror 38; moveable y-tilt vertical comb 38 is connected to section 120 of the upper frame layer;
2) conduct to movable y-tilt vertical comb 38.

Figure 6:
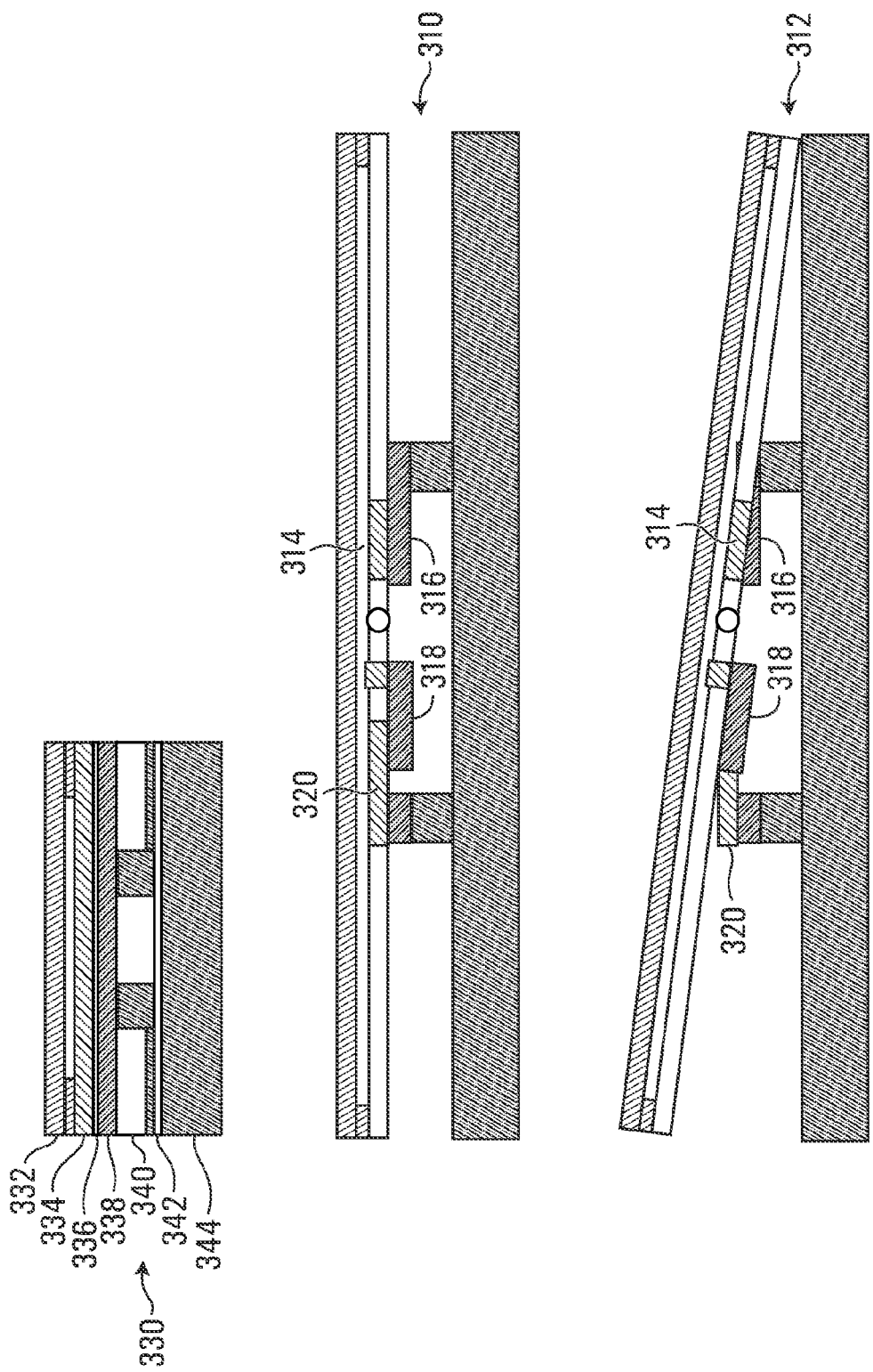
FIG. 6 is a side view of MEMS arrangement with a push-pull comb drive.

Referring now to FIG. 6, shown are side views of a variant of the above-described MEMS device. Generally indicated at 310 is a side view in which the y-tilt is not actuated. Generally indicated at 312 is a side view in which the y-tilt is actuated. Generally indicated at 330 is an example of a layer stack that might be used to implement this embodiment. The layers include a silicon substrate 344; a 1 micron oxide layer 342; a 40 micron silicon stand-off layer with trace regions thinned to 10 microns 340; a 10 micron lower silicon frame layer 338; a 1 micron oxide layer with conductive vias in selected regions 336; a 15 micron silicon frame layer 334; upper silicon frame layer 332 and a 15 micron silicon top layer with mirror regions thinned to 11.5 and 10 μm. The thinning of the mirror to 11.5 and 10 microns is detailed further below with reference FIG. 7. It is of course to be understood that these dimensions and materials are for the purpose of example only. With this embodiment, there are two sets of y-tilt vertical combs; a first set includes a moveable comb 314 in the upper frame layer and a static comb 316 in the lower frame layer, as in the above-described embodiment, and the second set includes a moveable comb 318 in the lower frame layer and a static comb 320 in the upper frame layer. Note that for the embodiment of FIG. 6, a push-pull configuration for the y-tilt is provided in which actuation is achieved through a simultaneous pull up on one side and pull down on the other side. This is in contrast to the embodiments of FIGS. 1 through 5 where the y-tilt electrodes only pull in one direction.

Figure 7:
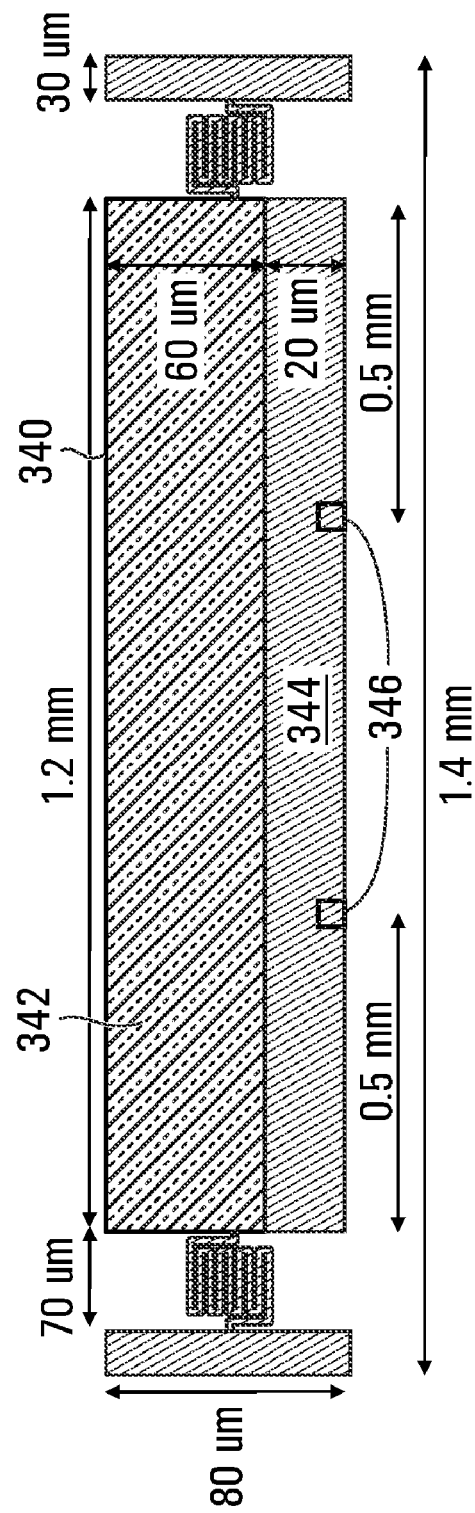
FIG. 7 is a top view of a MEMS arrangement with uneven mass distribution in the mirror.

FIG. 7 shows a plan view of the top silicon layer for the embodiment of FIG. 6. The top layer includes the mirror 34 which has areas of two thicknesses. A first area 342 is thinned to 11.5 μm while the second area 344 is thinned to 10 μm. The x-hinge thickness is set to give a first resonance frequency at around 1 kHz. The x-hinges in this example are approximately 15 μm thick by 1.5 μm wide, and have approximately 500 to 1000 μm effective length. Also shown are two hard stops 346 which are thinned to 11.5 microns. The hardstops 346 provide a small contact surface which limits the range of x-tilt motion (particularly useful for the binary control mode)—the small contact area limits stiction which could prevent the mirror from returning to a rest position. Also, the placement of the hardstops is chosen to ensure contact is only between the grounded mirror and the grounded section of the upper frame, while also creating a minimum separation, for example of 1.5 microns, between the grounded mirror and the x-electrode at full x-tilt.

Figure 8:
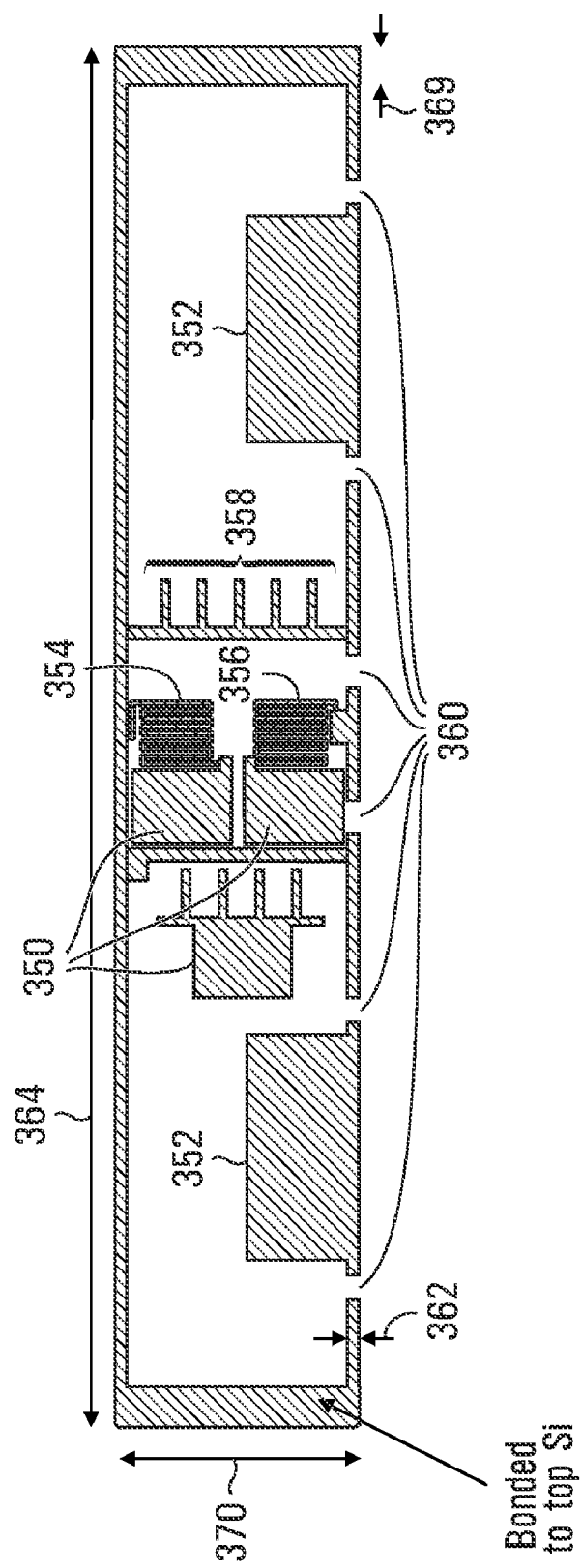
FIG. 8 is a plan view of an example upper frame layer implementation for the embodiment of FIG. 6.

FIG. 8 shows a plan view of the upper frame layer for the embodiment of FIG. 6. In this example, the upper frame layer is 15 microns thick. The anchor posts 350 are 28×28 μm and have 3 μm lateral clearance. The x electrodes 352 are 35×450 μm. The y-hinge 355,356 stiffness is set to give a first resonance frequency of around 1 kHz. They are about 15 μm thick by 1.5 μm wide and have approximately 100 to 200 μm effective length. The comb fingers 358 are 3 μm wide, have a 12 μm pitch and are approximately 50 to 100 μm long. In another example, the comb fingers are 75 to 150 μm long, for example 100 μm long. The frame has breaks 360 for isolation. The side of the frame is approximately 5 μm as indicated at 362. The overall length of the frame 364 is about 1.4 mm. The end of the frame 366 is about 30 μm. The x electrodes 352 are each placed about 25 μm from the ends of the frames. The width 370 of the frame is about 76 μm.

Figure 9:
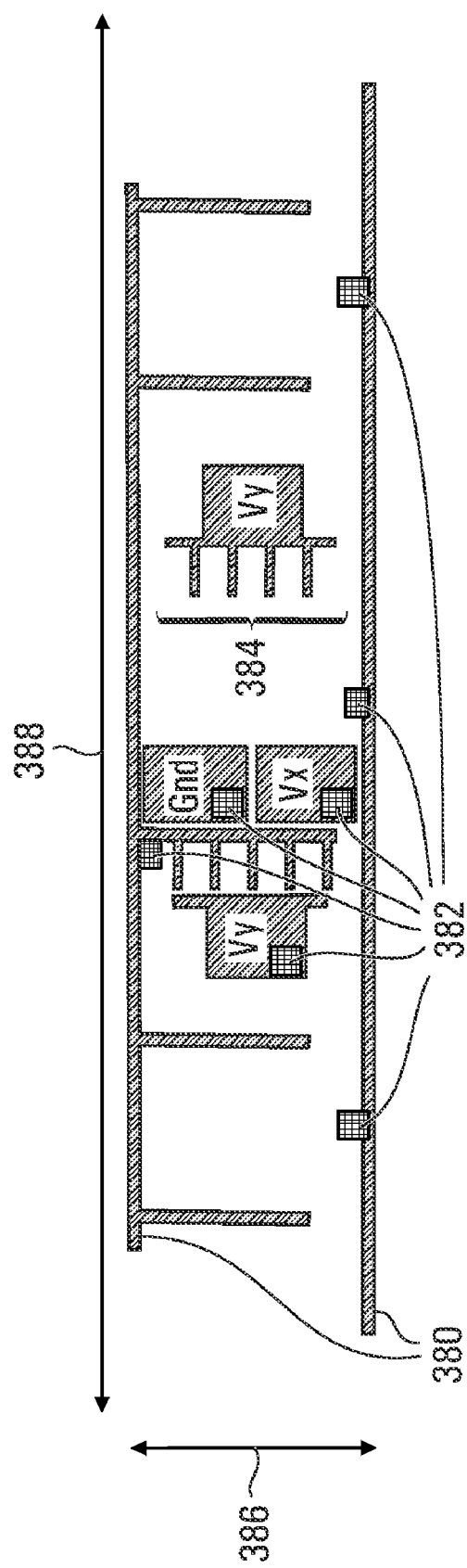
FIG. 9 is a plan view of an example lower frame layer implementation for the embodiment of FIG. 6.

FIG. 9 shows a plan view of the lower frame layer for the embodiment of FIG. 6. The lower frame layer has 5 μm wide frame sections 380. There are conductive vias 382 that connect the upper and lower frame layers. There are breaks in the frame for isolation as illustrated. There are comb fingers 384 that are 3 μm wide, have a 12 μm pitch are 50 to 100 μm long. In another example, the comb fingers are 75 to 150 μm long, for example 100 μm long. These overlap the comb fingers 358 of FIG. 8 by approximately 40 to 90 microns. In another example, these overlap the comb fingers 358 of FIG. 8 by approximately 65 to 140 microns. The width of the lower frame layer 386 is about 76 μm. The length 388 of the lower frame layer is about 1.4 mm.

Figure 10:
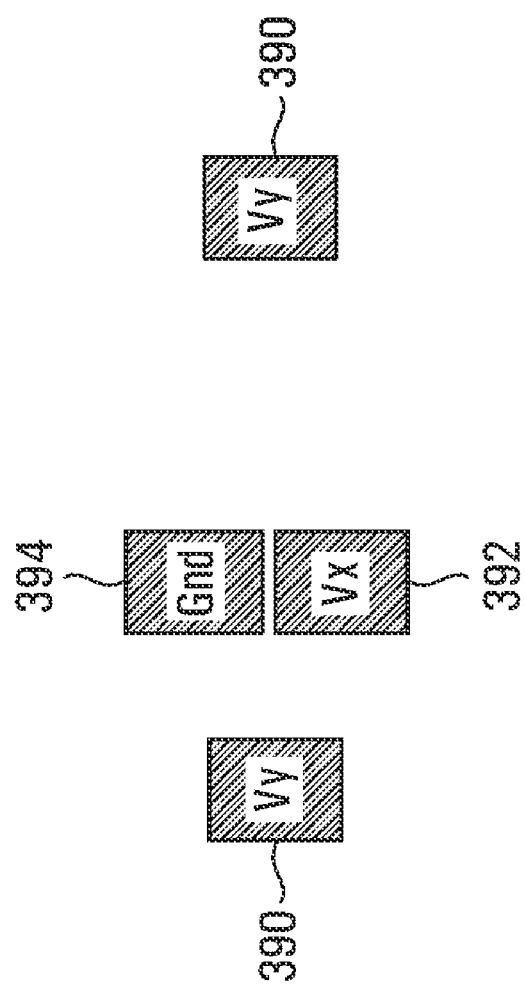
FIG. 10 is a plan view of an example standoff layer implementation for the embodiment of FIG. 6.

FIG. 10 shows the support/stand-off layer for the embodiment of FIG. 6. Shown are stand-offs 390 for the y voltage, stand-off 392 for the x voltage and stand-off 394 for ground voltage, all for delivering these voltages to the frame layers.

Figure 11:
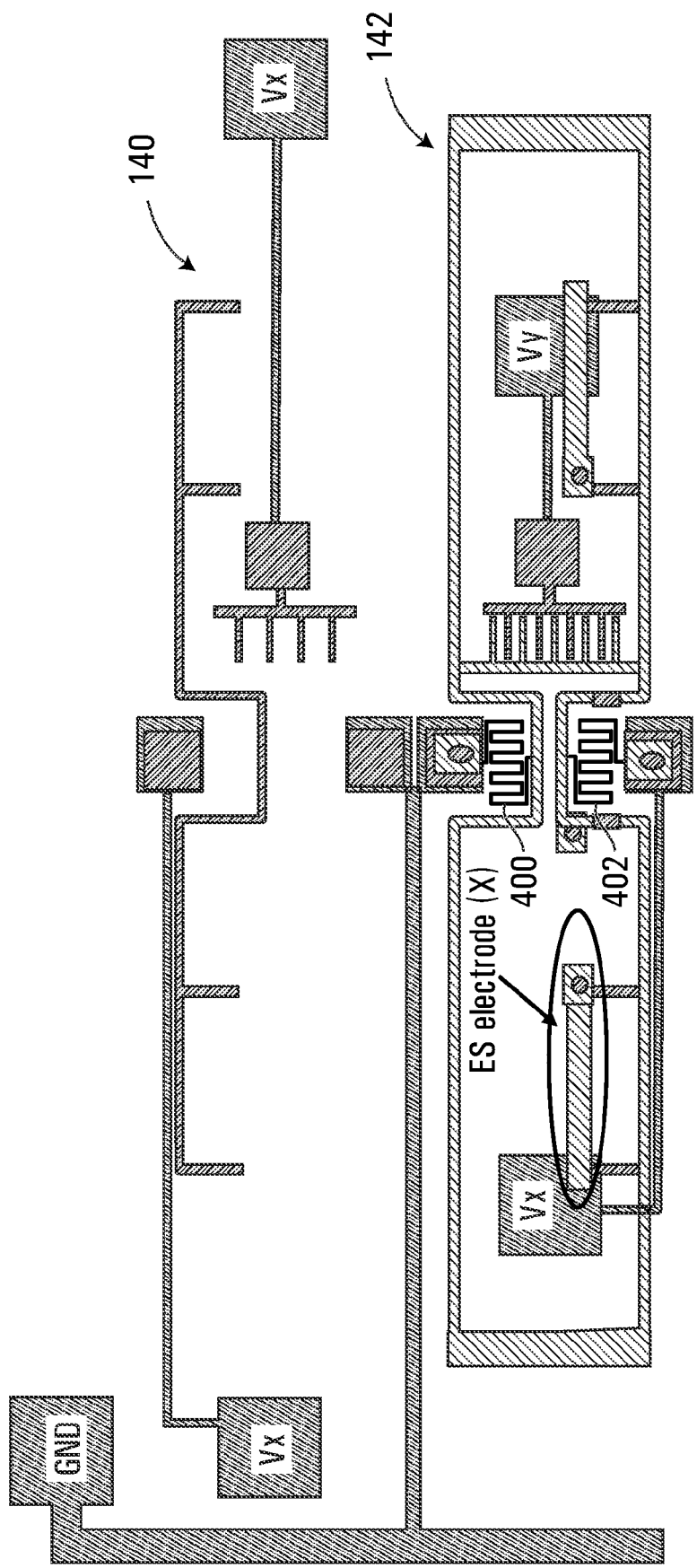
FIG. 11 is a plan view of an example lower support layer implementation for the another embodiment featuring a different arrangement for the y-hinges.

FIG. 11 shows plan views of a lower support layer generally indicated at 140 and an upper support layer generally indicated at 142 for another design variant. Note that these layers are shown for two different adjacent devices. The lower support layer 140 corresponding with the upper support layer 142 would be a reflection in the x-axis of that shown at 140. For the example of FIG. 11, the electrode layout is similar to the embodiment of FIGS. 1 through 5. The arrangement of the y-hinges 400,402 is somewhat different with the hinges shown connected to the upper frame layer and extending generally in the direction of the y-axis to connect to the supports. However, the function of these hinges is generally the same as that of hinges 46,48 of FIG. 1, namely to allow rotation of the frame in the y-axis.

Figure 12:
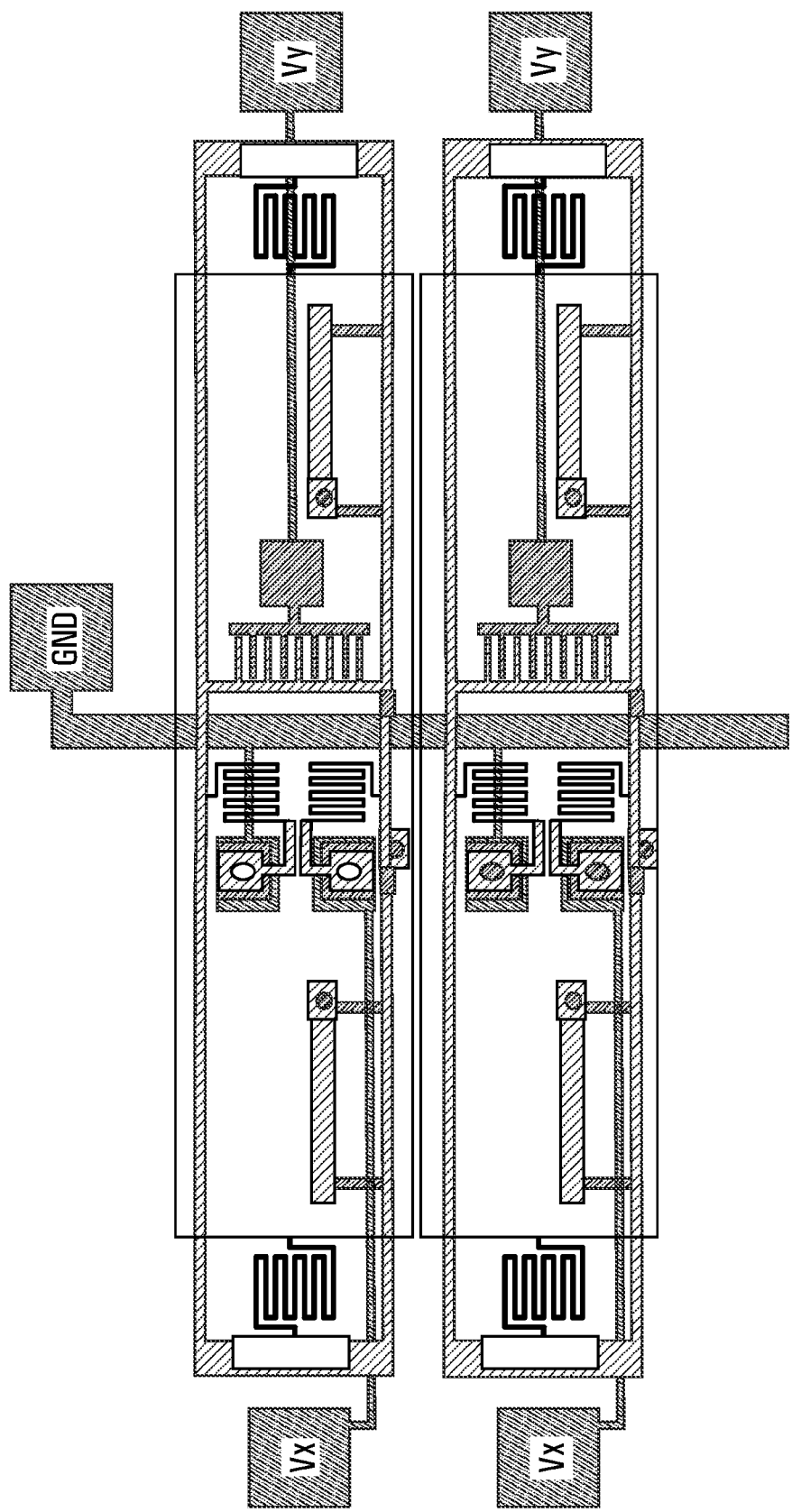
FIG. 12 is a plan view of an another embodiment.

Referring to FIG. 12, shown is another embodiment that is similar to that of FIG. 11, but which features a post and y-hinge arrangement similar to the embodiment of FIGS. 1 through 5.

Figure 13:
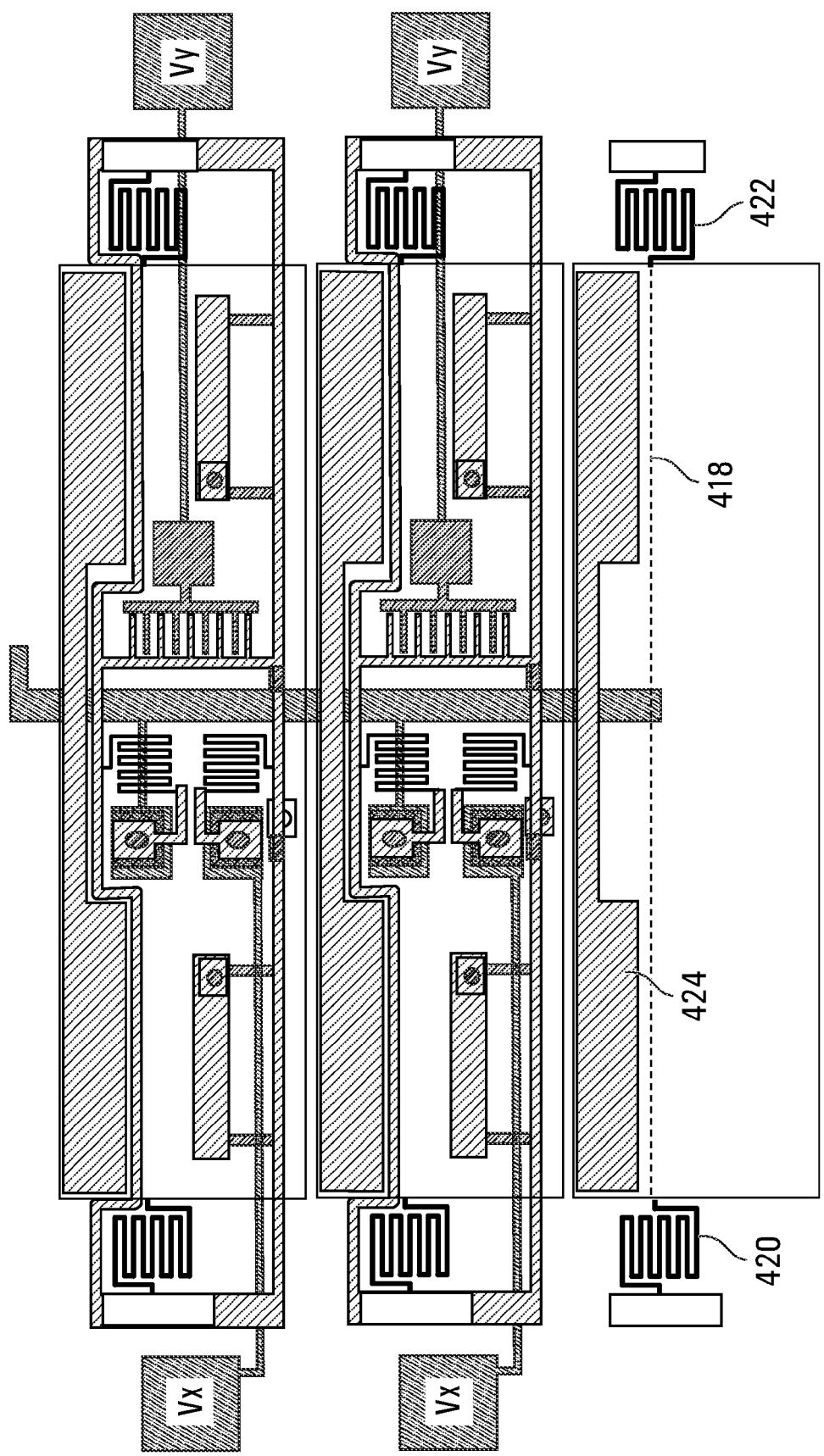
FIG. 13 is a plan view of an another embodiment in which the x-axis is offset from the center of the frame and from the center of the mirror.

Referring now to FIG. 13, shown is another variant in the design in which the x-axis 418 is offset from the center of the frame and from the center of the mirror. This is achieved by having the x-hinges 420,422 offset from the central position. Advantageously, this results in a larger area of the mirror being available for the purpose of x-drive torque. In some embodiments, mass balancing of the mirror is performed by including frame material in portions of the mirror on the side of the x-axis where the mirror is smaller. In a specific example of this, mass in the frame layer in area 424 is included beneath the mirror to make the portion of the mirror on that side of the axis approximately equal in mass to the portion on the other side of the axis. In a specific example implementation for the embodiment of FIG. 13, the mirror is approximately 80 microns wide by 1200 microns in length and has portions that are 10 microns thick and 46 microns thick where the frame layers are attached. The x-hinges are attached so that the x-axis of rotation is located 54 microns from one mirror edge and 26 microns from the other edge. The volume of silicon material on Side 1 (W×L×T)=54×1200×10 microns=648 k μm^3. The distance from mass centroid of side1 to x-axis=27 microns. The distance from mass centroid of side2 to x-axis=13 microns. Therefore, side2 needs to have 2× larger mass than side 1. Side 2 (W×L×T)=26×850×46 microns+26× 350×10 microns=1108 k μm^3 (close to balanced). This example results in balancing the torque from the 2 sides; since their mass centroids are not equal distances from the tilt axis, the masses have been to be adjusted to compensate.

Figure 14:
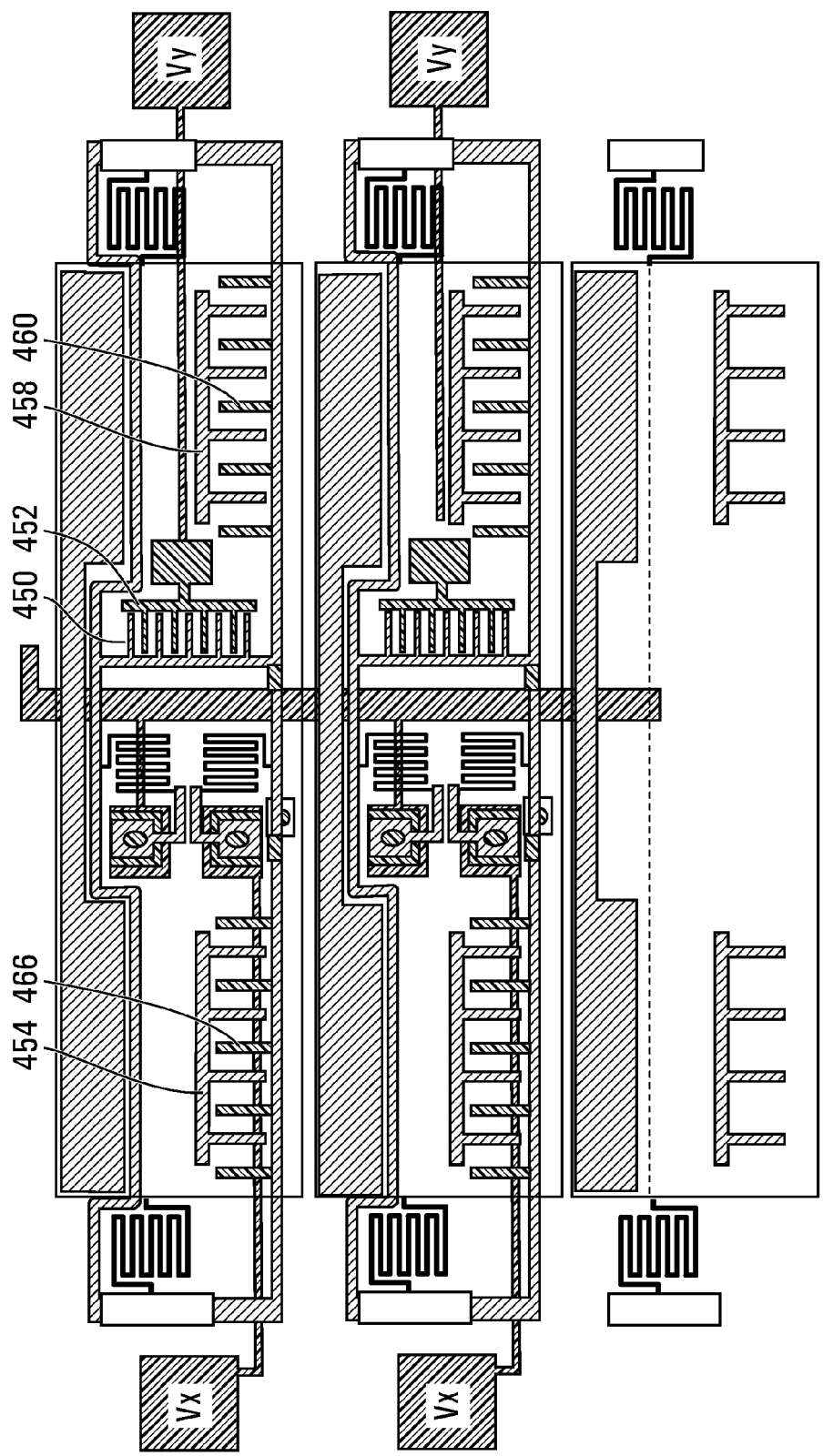
FIG. 14 is a plan view of another embodiment featuring comb drive for both x and y tilt.

Referring now to FIG. 14, shown is another variant in which a comb drive is provided for both x and y tilt. In the illustrated example, there is a pair of vertical combs 450,452 for y-drive and two pairs of vertical combs 454,456 and 458,460 for x-drive. The embodiment of FIG. 14 also features an offset x-axis and mass balancing as described above for the embodiment of FIG. 13 but it is to be understood that the comb drive for the x-axis could also be implemented in an embodiment without an offset x-axis. The pairs of vertical combs for x-drive include a rotor 450 in the upper frame layer connected to the mirror and a stator 452 in the lower frame that is connected to the frame. The y combs are as described previously with reference to the embodiment of FIG. 1A.

Figure 15:
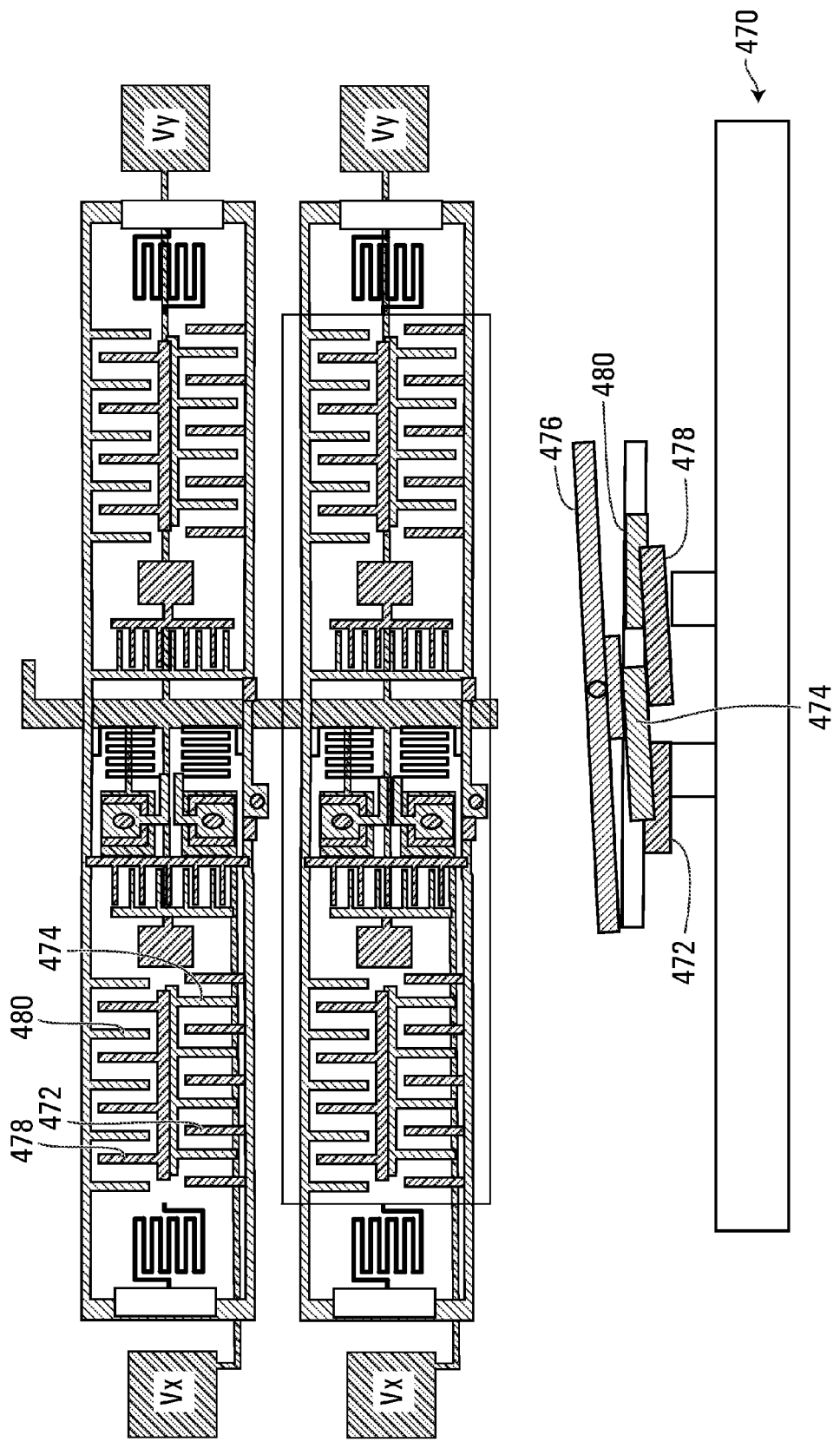
FIG. 15 is a plan view of another embodiment featuring push-pull comb drive configurations for both x and y tilt.

FIG. 15 shows another variant featuring push-pull comb drive configurations for both the x and y tilt. The y-drive is as described previously with reference to FIG. 6. the x-drive can best be understood with reference to the end view generally indicated at 470. There is a stator comb 472 in the lower frame layer 70; a rotor comb 474 in the upper frame layer that is attached to the mirror 476; there is another rotor comb 478 in the lower frame layer connected to the mirrors and another stator comb 480 in the upper frame layer. This arrangement is repeated in either side of the y-axis.

Figure 16:
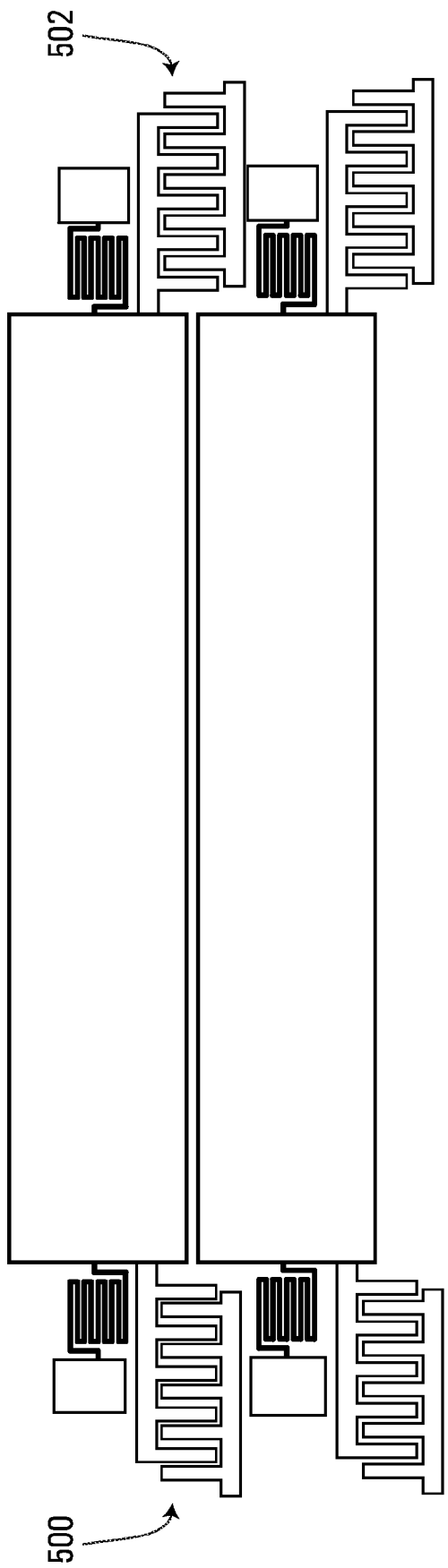
FIG. 16 is a plan view of another embodiment in which a pair of comb drives are used for x-tilt drive, but the x-tilt combs are placed outside the mirror area.

FIG. 16 shows another variant in which pairs of vertical combs are used for x-tilt drive. In this embodiment, the x-tilt combs 500,502 are placed outside the mirror area, but inside the frame (not shown). This approach allows for more off-axis torque, but requires a longer frame than in the other embodiments.

Figure 17:
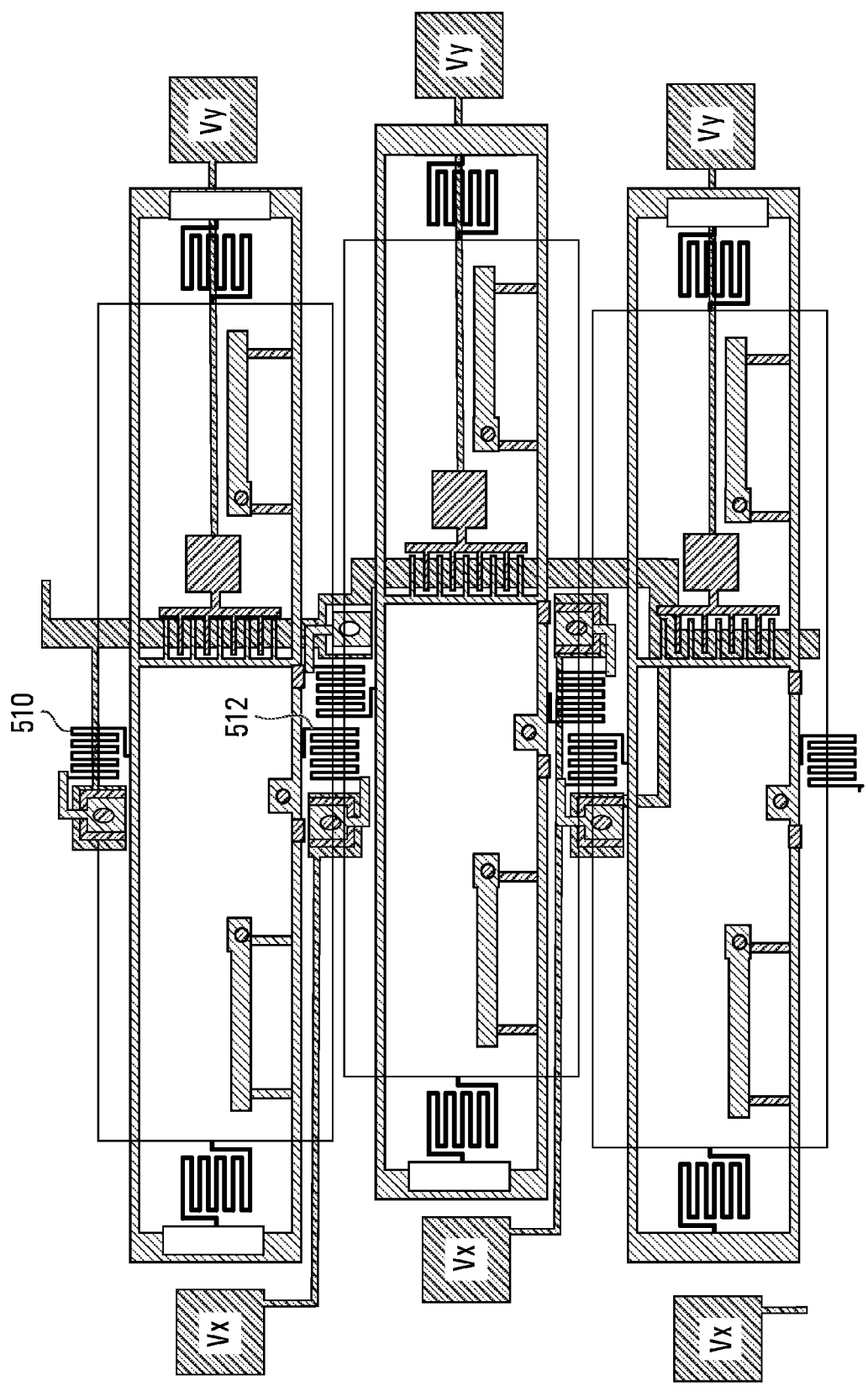
FIG. 17 is a plan view of another embodiment in which y-hinges are located outside the frame area.

FIG. 17 shows another variant which is similar to the embodiment of FIG. 1A except for the fact that there are y-hinges 510,512 located outside the frame area. In the particular example depicted, each y-hinge straddles an area that is partially beneath the mirror and partially beneath the mirror of an adjacent neighbour. There are no completely "hidden" hinges for the embodiment of FIG. 17. In order to have the devices as close together as possible, in some embodiments adjacent devices in FIG. 17 are offset slightly from each other along the x-axis as illustrated.

Figure 18:
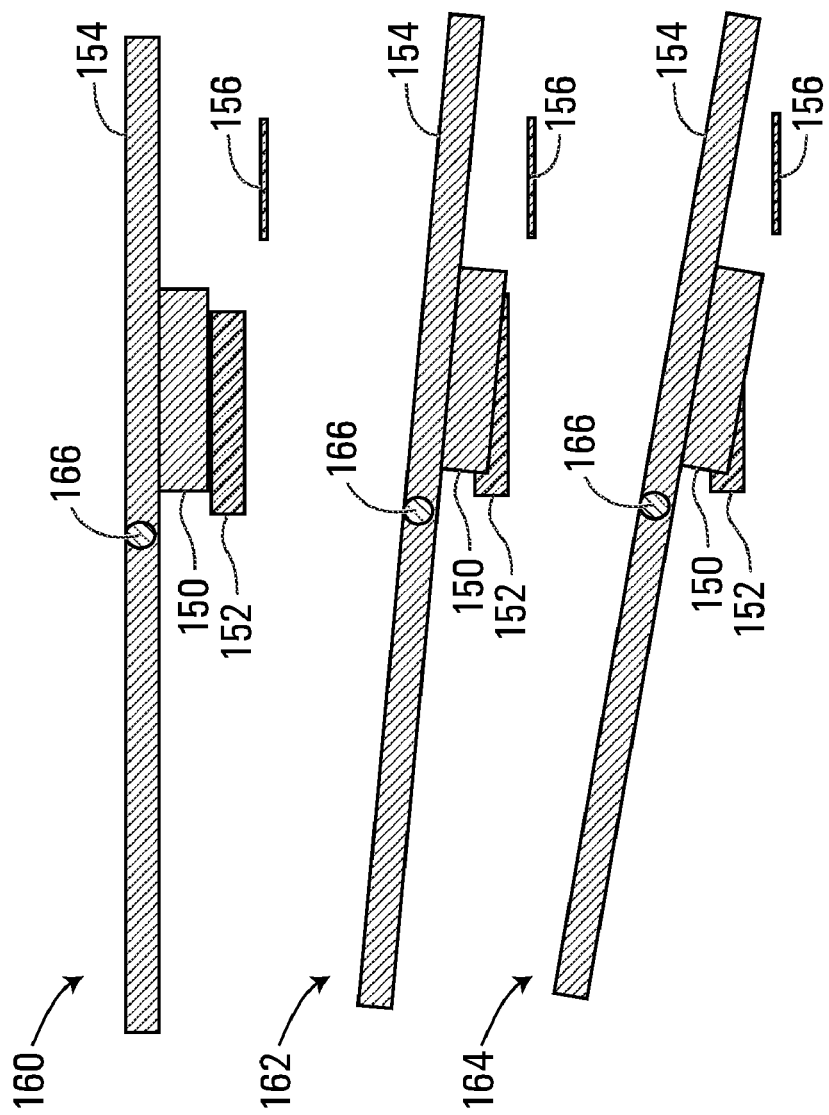
FIG. 18 is a side view of a hybrid drive arrangement combining comb drive and electrostatic plate drive.

Referring now to FIG. 18, shown is yet another option for electrostatic actuation. This will be referred to herein as a "hybrid" drive because it combines both a comb drive and electrostatic plates. Specifically, there is shown a pair of vertical combs 150,152, one of which is connected to ground and the other of which is connected to an actuating voltage. In addition, the mirror (or other device to be rotated) is indicated at 154 and is connected to ground, and there is an electrostatic plate 156 that is connected to receive the actuating voltage. At rest, the configuration takes the appearance generally indicated at 160. The initial gap between the mirror 154 and the electrostatic plate 156 is too large for actuation (at least using any reasonable voltage) and the comb drive 150,152 dominates. The end of phase one of actuation is indicated at 162. Assuming that the comb drive has been actuated, that causes rotation in the rotation about the axis of rotation 166 but at a certain point, the comb drive will run out of torque. However, the rotation thus achieved will reduce the gap between the electrostatic plate 156 and the mirror 154 and create a secondary drive. At this point, the electrostatic plate 156 and mirror 154 will dominate the drive. This allows the mirror to be rotated slightly more to the position indicated at 164. Note that at this point, the comb drive 150,152 is overdriven, and this will provide pull back (in the opposite direction of rotation above the axis of rotation 166) to resist snap between electrostatic plate 156 and mirror 154. This type of drive can be employed for any of the embodiments described above featuring comb drives. More generally, this type of hybrid drive can be applied in devices and systems other than the particular MEMS device with independent rotation and two axes of rotation described herein. For example, it could be applied in a system in which rotation in a single axis of rotation is of interest.

Figure 19:
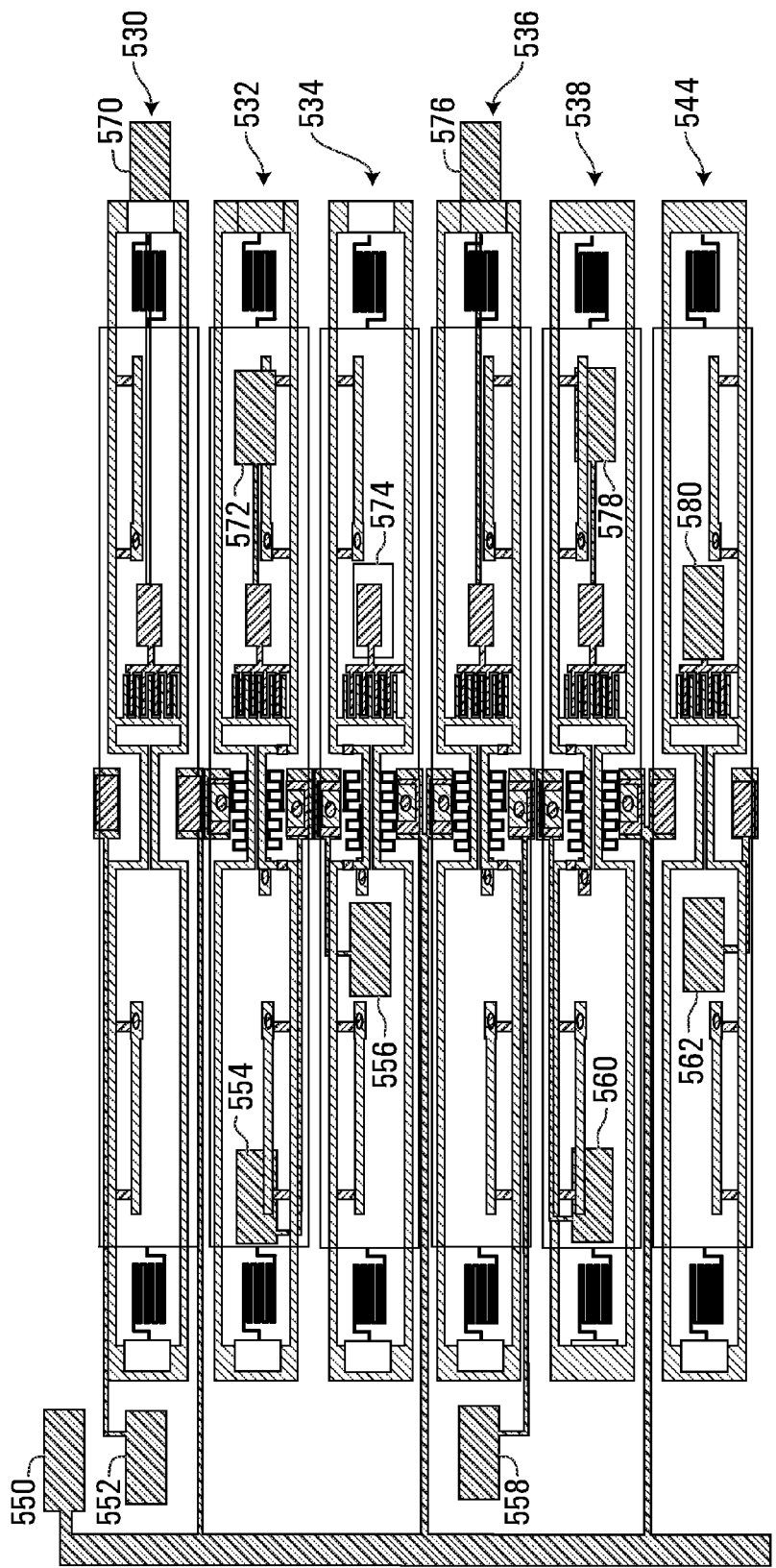
FIGS. 19 and 20 are plan views of a staggered contact arrangement.
Figure 20:
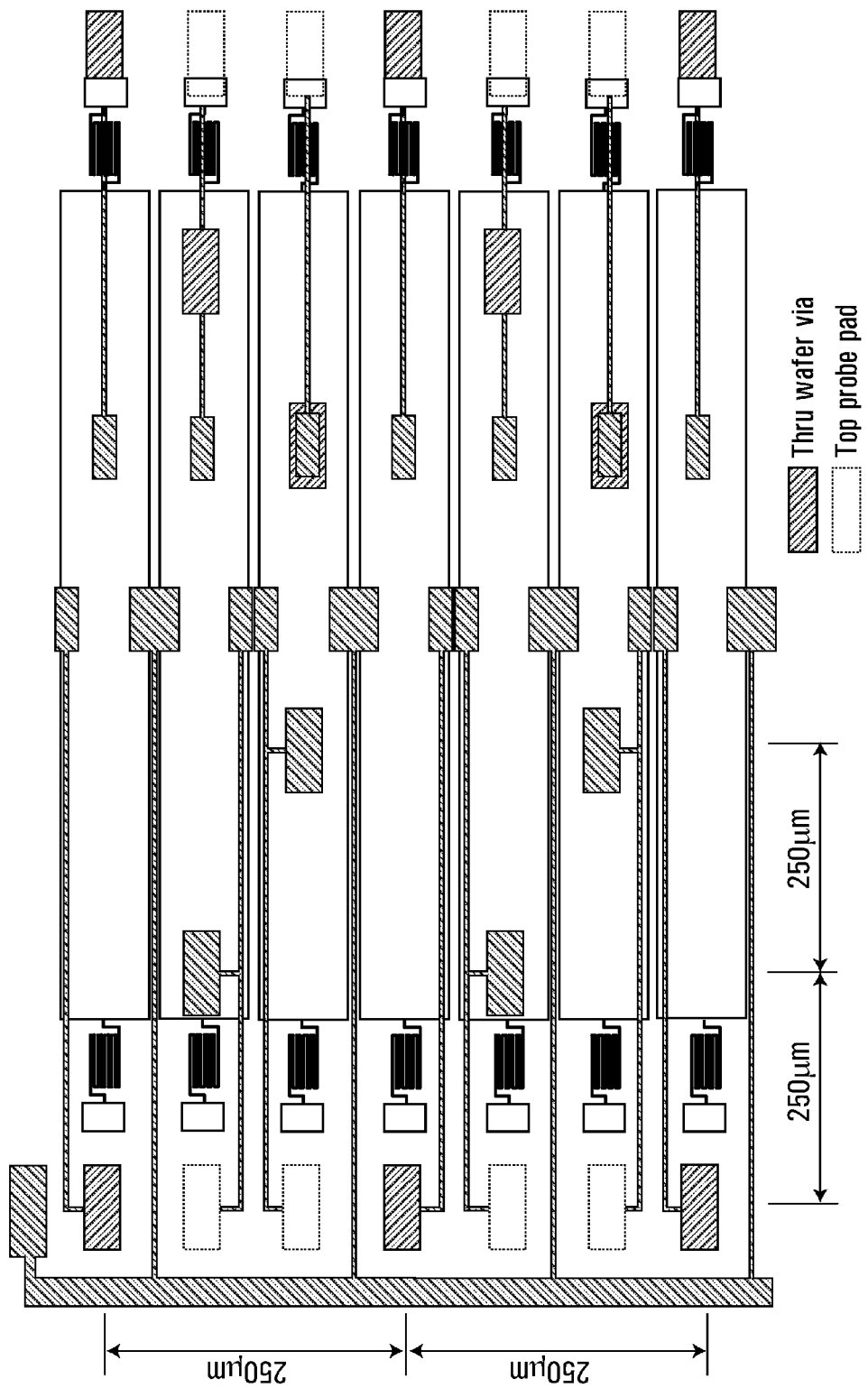

Referring to FIG. 19, in some embodiments, staggered contact arrangements are employed to allow the devices to be implemented closer together. Shown is a set of six devices generally indicated at 530,532,534,536,538 and 544. In FIG. 19, the ground connections are all routed to a common bus on the left hand side (one contact pad 550). Respective X-axis drive voltages are routed to staggered contacts 552, 554,556, 558,560,562 on the left side of the y-axis. Respective Y-axis drive voltages are routed to the staggered contacts 570,572, 574,576,578,580 on the right side of the y-axis. This staggered configuration is particularly beneficial when used with through-wafer vias to the backside of the bottom substrate. With the example of FIG. 19, the spacing between the contacts in the x-axis is a minimum of 250 micrometers. The spacing between consecutive aligned contacts in the y-axis is also 250 micrometers. The result is that any two contacts are at least 250 micrometers apart, this is not withstanding the fact that in the y direction, the devices are spaced much closer than that, and in the illustrated example, there are three devices within the 250 micrometer spacing. Another view of this is shown in FIG. 20. These electrode arrangements are advantageous when combined with through-wafer vias in the lower substrate wafer so as to provide a 2-dimensional grid array of electrical contacts on the backside of the substrate.

Figure 21:
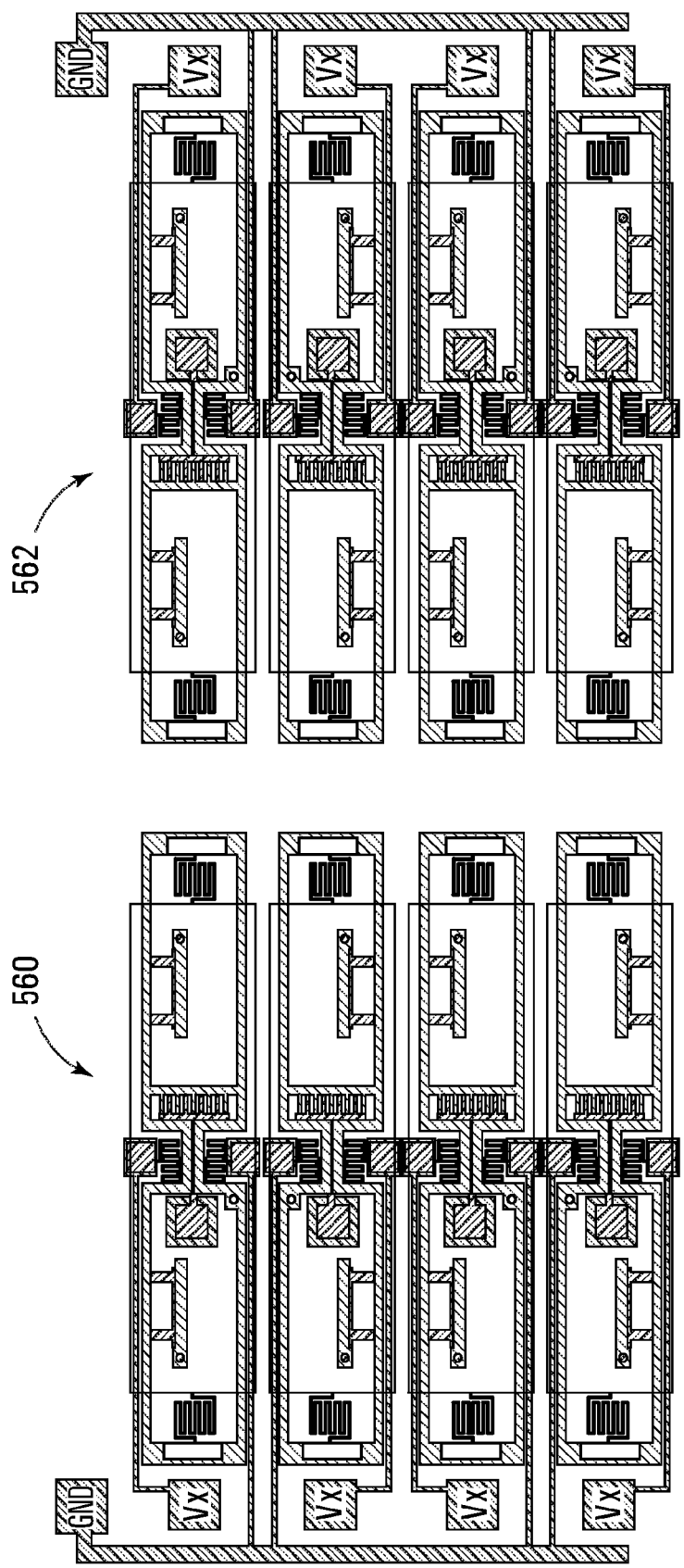
FIG. 21 is a plan view of a MEMS arrangement featuring two rows of MEMS devices.
Figure 22:
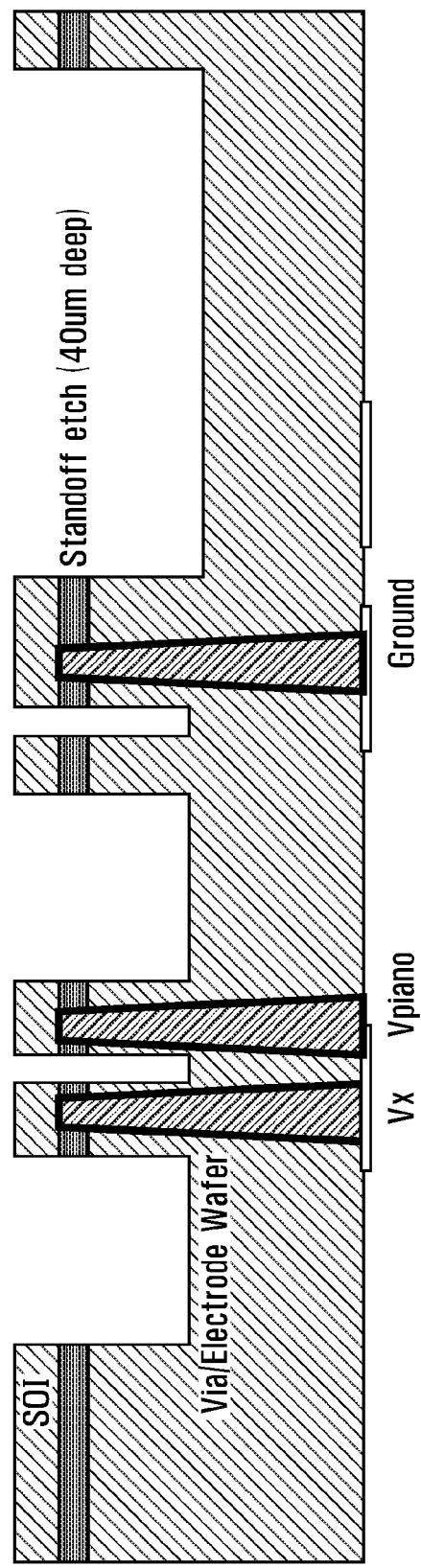
FIGS. 22 to 27 are diagrams showing an example of a process for implementing some of the embodiments.
Figure 23:
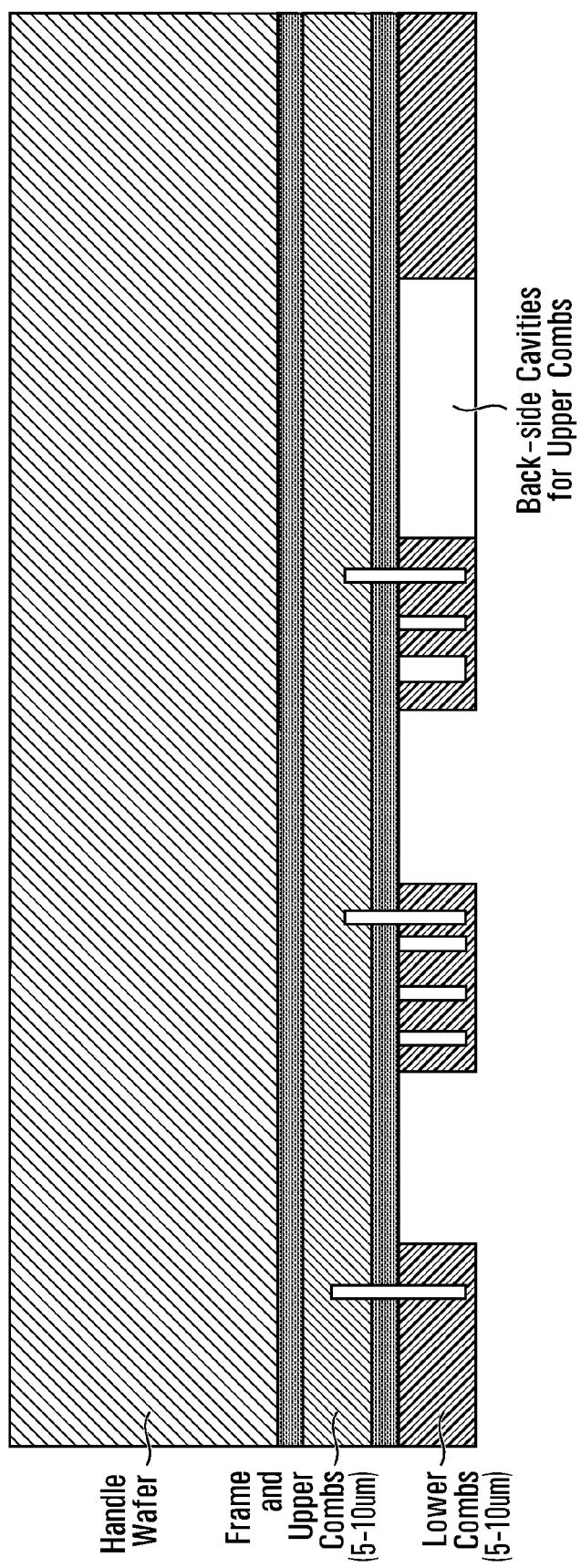
Figure 24:
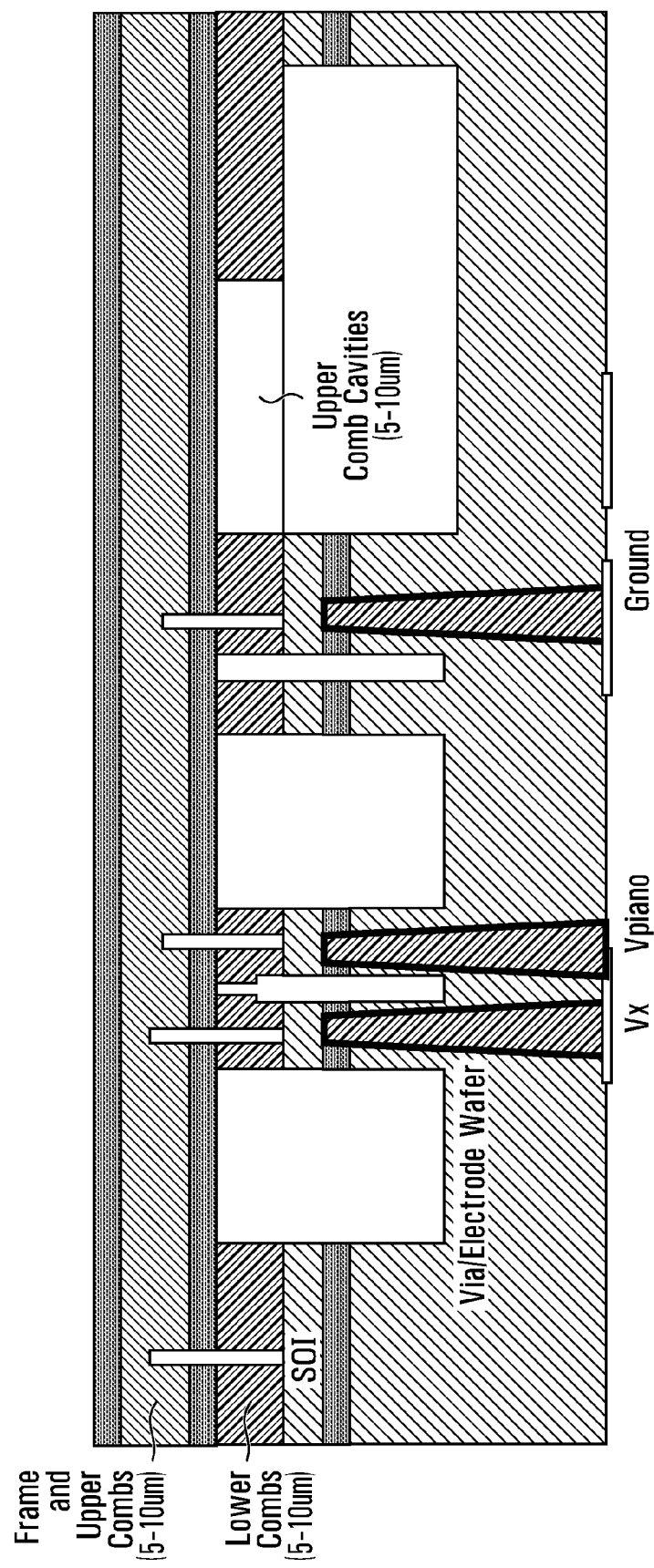
Figure 25:
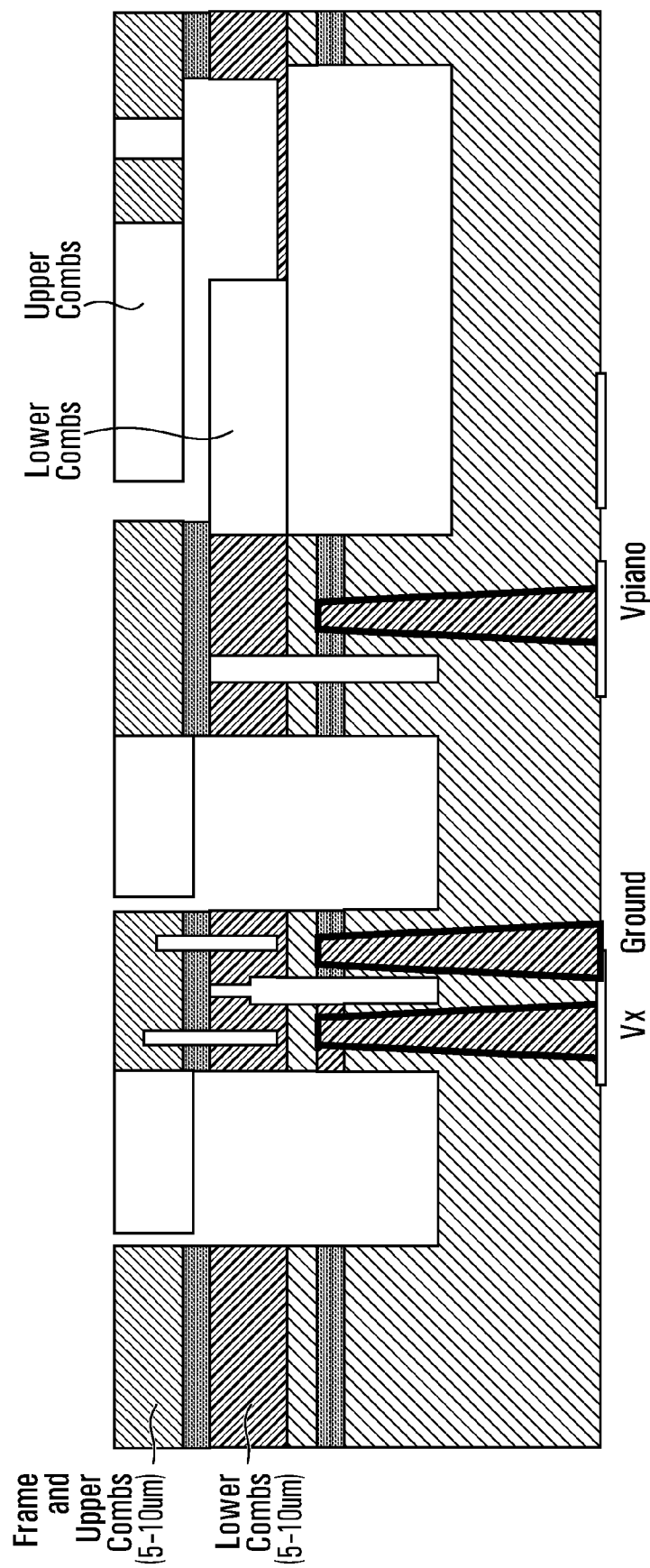
Figure 26:
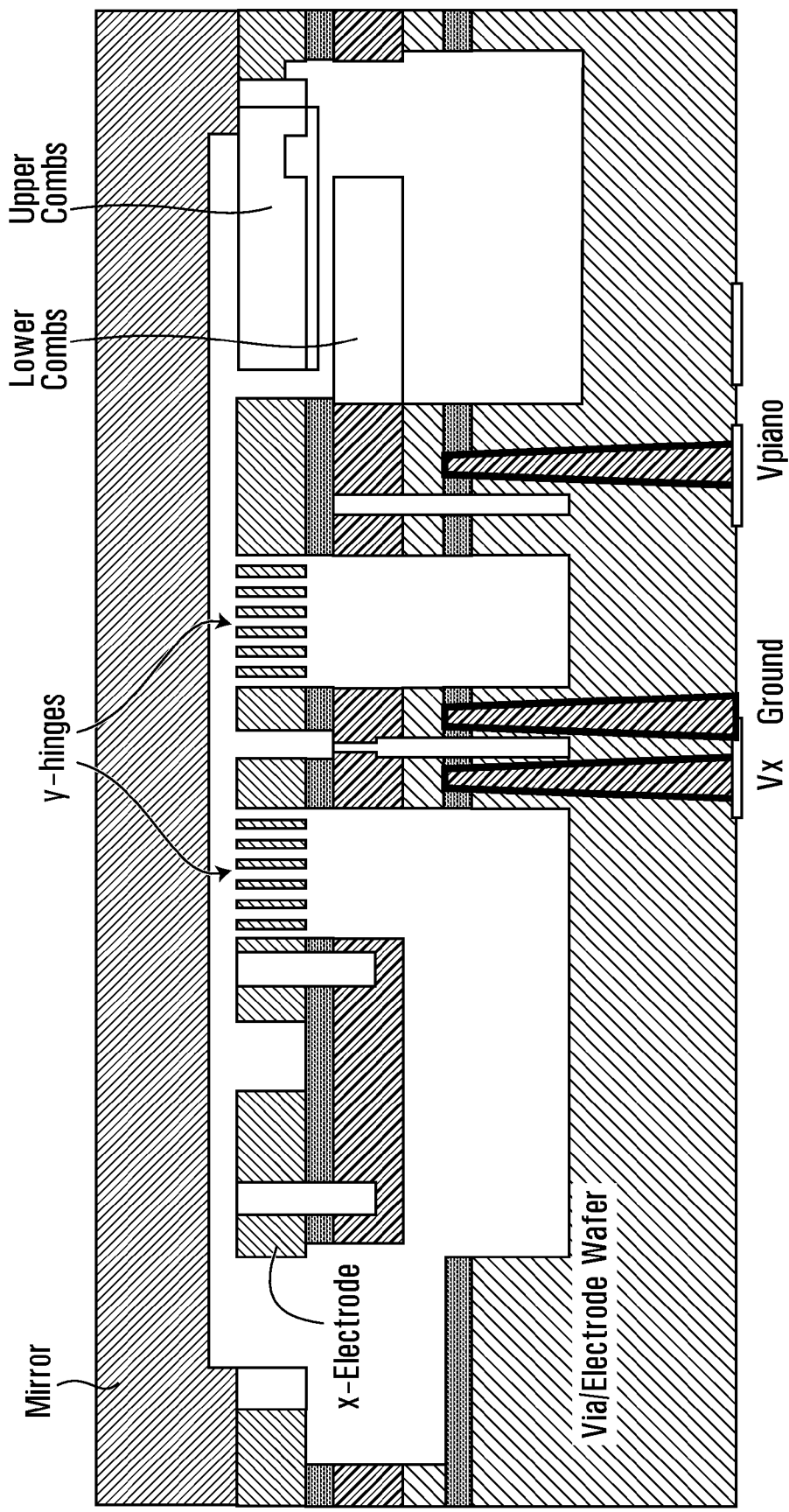
Figure 27:
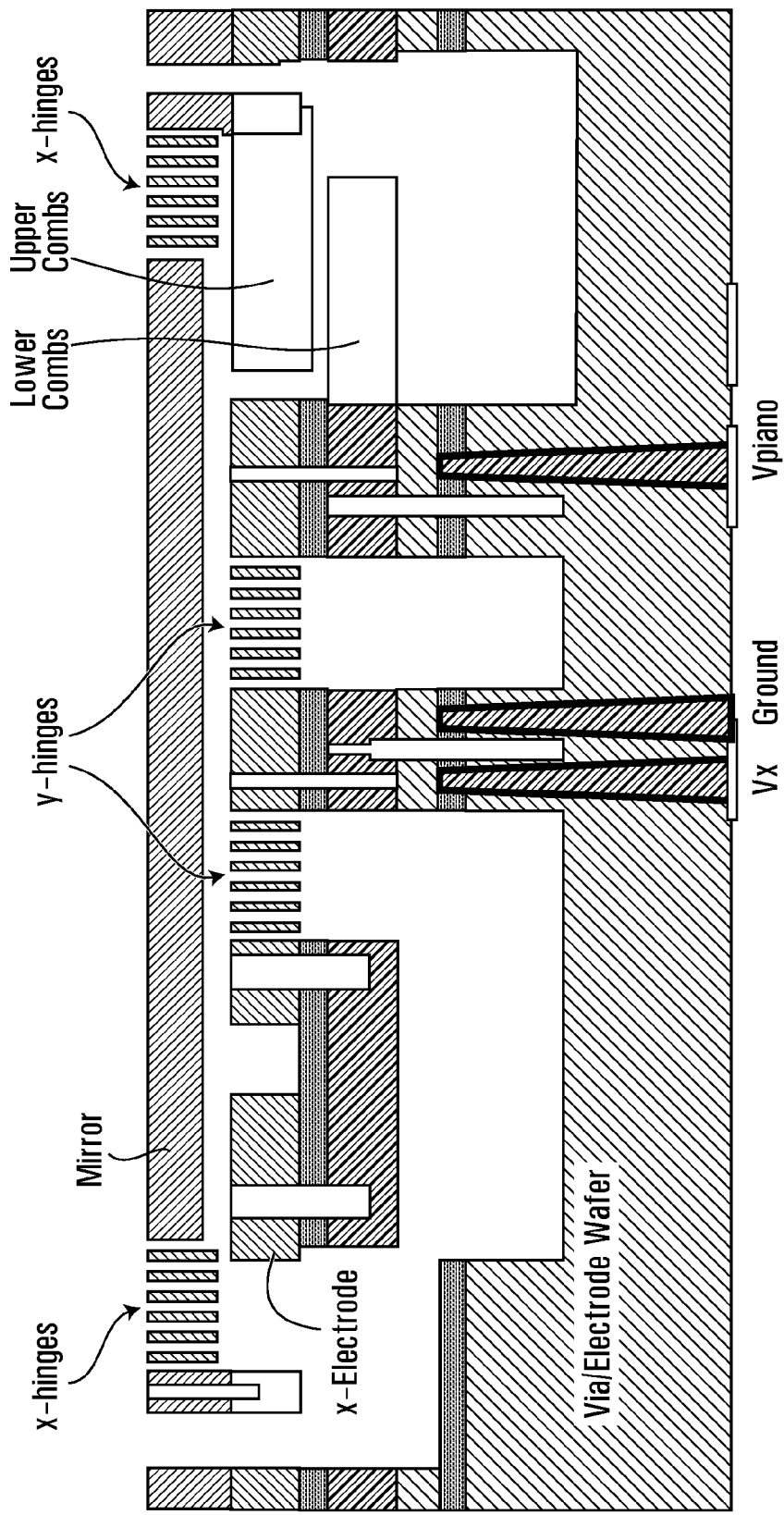

FIG. 21 shows another variant in which there are two rows 560,562 of MEMS devices. This embodiment features the use of thru-wafer vias in the electrical substrate to allow two rows of MEMS devices with close spacing between the rows. This reduces the amount of routing required.

FIGS. 22 through 27 show an example of a process for implementing the above embodiments. This is a specific example and of course other processes could alternatively be used.

It can be seen that in general, embodiments of the invention feature a frame that supports a rotatable element, such as a mirror, so as to allow the rotatable element to rotate about a first axis of rotation, such as the x-axis. In the examples described above, a pair of hinges is used to support the rotatable element to the frame in this manner. There is a pair of interconnections that connect the frame to a pair of supports so as to allow the frame to rotate about a second axis of rotation such as the y-axis. In the illustrated embodiments, these have included hinges such as shown in FIG. 1, but more generally other forms of flexible ligature can also be employed. Typically the rotatable element is allowed to rotate about the first axis of rotation through the inclusion of hinges that interconnect the rotatable element to the frame. Other types of interconnections are contemplated. For example, the rotatable element could be structured as a cantilever with the rotatable element bonded on one side of the entire length of the frame and thinned near the bonded edge to allow bending for x-tilt. Another similar variant includes the use of compliant springs on the "free" edge of the cantilever.

The device features a first electrostatic actuator formed so as to rotate with the frame in the second axis of rotation for actuating rotation in the first axis of rotation. This typically involves forming the first electrostatic actuator at least partially in one or both of the layers used to form the frame and partially on the element to be rotated; both the frame and the element to be rotated rotate with the frame in the second axis of rotation. The actuator can be internal to the frame as in the embodiments described, or may be completely or partially external to the frame in other implementations. While all the embodiments assume actuation by electrostatic actuator, other types of actuators may alternatively be employed, such as electromagnetic to name a specific example. Referring to the example of FIG. 1, the x-electrodes 50,52 are formed in the frame. Because of this, the x-electrodes 50,52 rotate with the frame thereby allowing a very small x-gap to be maintained. Other examples have also been described. For example, in the embodiment of FIG. 14 featuring comb drive for both x and y, each pair of combs for x-drive includes one formed in the frame and one connected to the underside of the mirror. Once again, the proximity of the mirror to the frame allows for a small gap between the two electrodes to be maintained. Also important in this case, is the fact that both sets of x-combs rotate together during y-axis tilt, thereby preventing any twisting of the combs which could cause them to bind. In the embodiments described, there is an x-voltage applied to the x-electrodes, and ground is applied to the other electrode for actuating rotation in the first axis of rotation. More generally, at least for electrostatic actuator implementations, first and second voltages are applied, and it is the difference between the voltages that sets up the electrostatic attraction.

A second electrostatic actuator is provided for actuating rotation in the second axis of rotation. In the embodiments described, vertical combs are used to provide for rotation in the y-axis. Various examples have been described; in FIG. 1, a single comb drive is provided for y rotation; in FIG. 6, a push-pull arrangement for the y-tilt combs is employed in which two pairs of combs are used for y rotation. In the embodiments described, there is y-voltage applied to one of the y-tilt combs, and ground is applied to the other y-tilt comb for actuating rotation in the second axis of rotation. More generally, at least for electrostatic actuator implementations, first and second voltages are applied, and it is the difference between the voltages that sets up the electrostatic attraction. While all the embodiments assume actuation by electrostatic actuator, other types of actuators may alternatively be employed, such as electromagnetic to name a specific example.

In some embodiments, the first pair of interconnections, for example the y-hinges, are entirely hidden by the top mirror; in other embodiments, the first pair of interconnections are slightly exposed, for example as shown in FIG. 17 where the y-hinge is straddled in area beneath the mirror and an adjacent neighbour.

In some embodiments, various techniques may be used to bond the various layers together. Specific examples include thermal, solder, polymer, thermo-compression, ultrasonic thermo-compression, and anodic bonding. Bond interfaces might for example include be Si/Si, Si/Silicon-Oxide, Silicon-oxide/Silicon-oxide, Silicon/metal/silicon, silicon/metal/oxide, Oxide/metal/oxide.

Figure 28A:
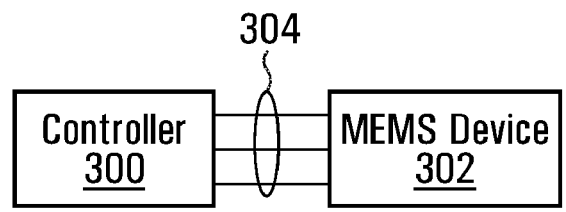
FIG. 28A is a block diagram of a MEMS system provided by an embodiment of the invention.

With reference to FIG. 28A, another embodiment provides a MEMS arrangement that has a controller 300 and a MEMs device 302. The MEMs device 302 is a MEMs device that is controllable to have x-tilt and y-tilt, in which x-tilt and y-tilt control are substantially decoupled. A specific example is the MEMs device described with reference to FIG. 1. The controller is implemented at least partially in hardware such as a chip or controller device. The implementation may include software running on the hardware. The controller 300 is connected to the MEMs device 302 through three connections 304 for delivering x-voltage, y-voltage and ground.

Figure 28B:
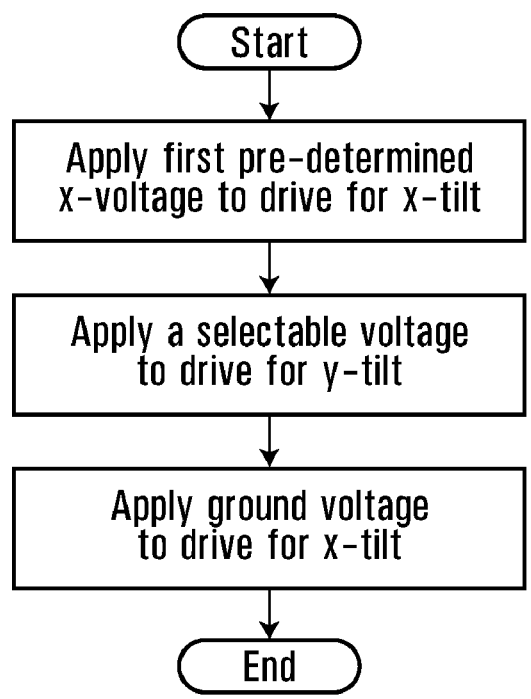
FIG. 28B is a flowchart of a method of controlling a MEMS device provided by an embodiment of the application.
Figure 29A:
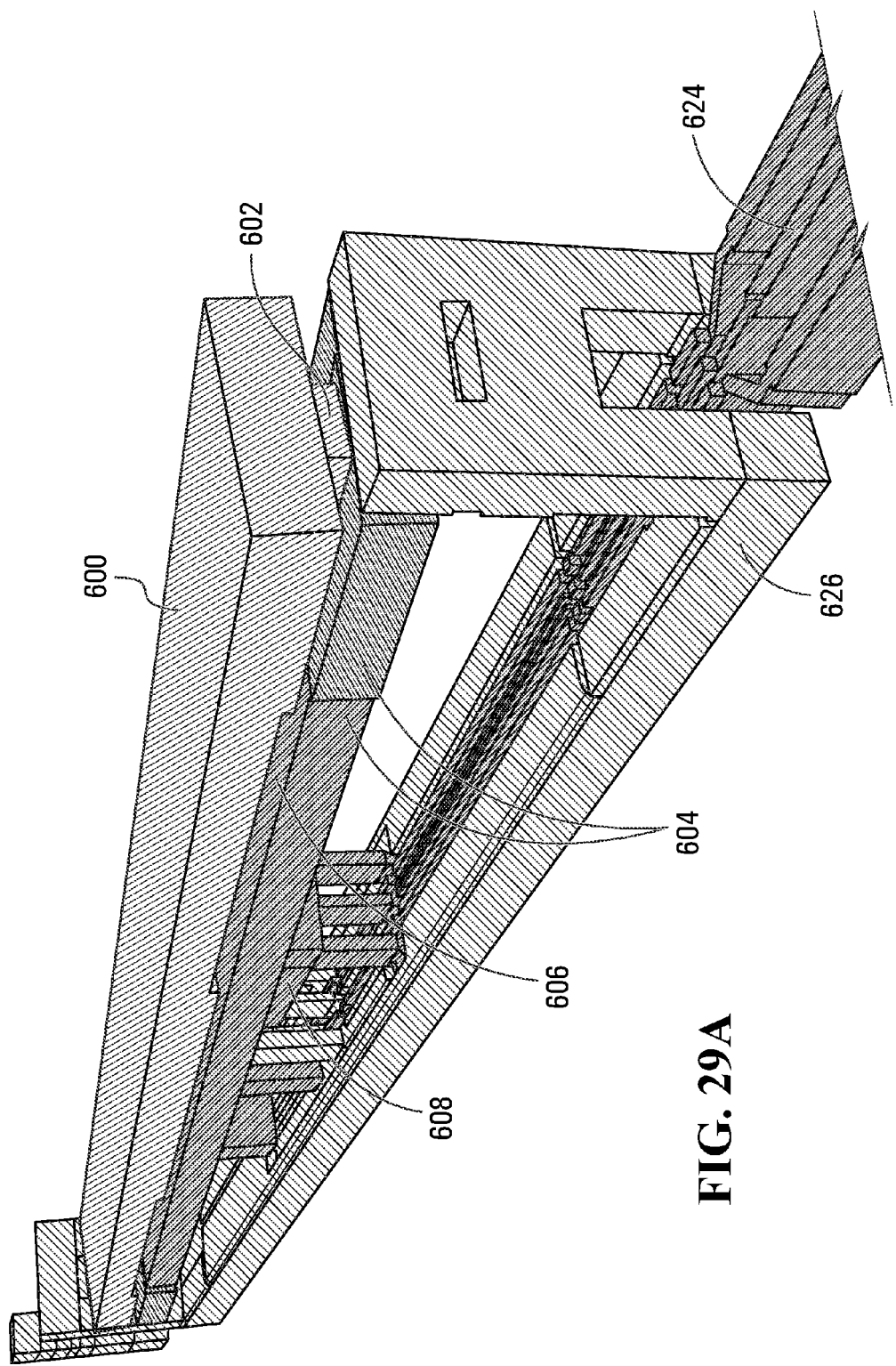
FIGS. 29A and 29B are perspective views of a MEMS arrangement featuring a single layer support layer with electrically isolating trenches.
Figure 29B:
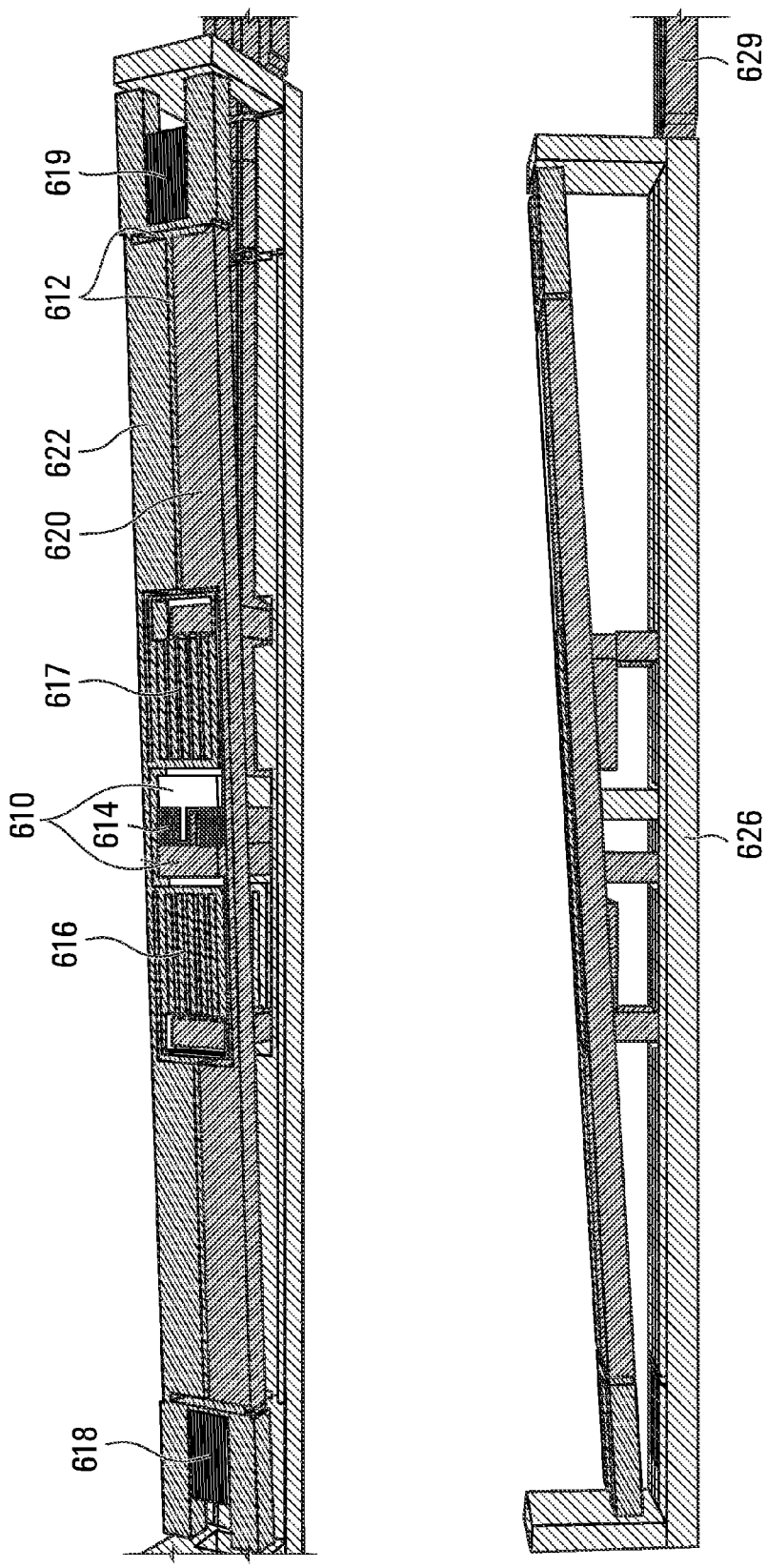

The operation of the arrangement of FIG. 28A will now be described with reference to FIG. 28B. The method begins in step 28B-1 with the application of a first pre-determined x-voltage for driving x-tilt. This causes rotation in the MEMs device in the x-axis away from a default state. The method continues in step 28B-2 with the application of a selectable voltage to the y-voltage for driving the y-tilt. The degree of rotation in the y-axis is controlled through appropriate selection of the selectable voltage. The method continues in step 28B-3 with the application of ground to the x-voltage. This causes rotation of the MEMs device in the x-axis back to the default state. It can be seen that operation in the x-axis is binary in nature. In some embodiments, the MEMs device is a device with high fill factor, for example >90% The embodiments described above have featured x-hinges that are not hidden by the upper mirror layer. In addition, the frame layer was composed of two layers that structurally behave as one layer but have electrically isolated regions. Another embodiment of the invention is shown in FIGS. 29A and 29B. In this embodiment, the x-hinges are hidden by the upper mirror layer, and the frame layer is formed of a single structural layer with electrical isolation trenches to create electrically isolated regions. It is noted that these two changes, namely the hidden x-hinges and the single frame layer with electrical isolation trenches are each implementable separately and can be included with any of the embodiments as described previously. The view of FIG. 29A shows the top mirror layer 600 in place whereas the view of FIG. 29B shows the top mirror layer removed to enable depictions of the details of the frame layer with full detail. The frame layer 604 has a first area 620 upon which x-axis parallel plate electrostatic drive electrode 606 are located. There is also a second section 622 of the frame 604 which is connected to ground. A pair of y-hinges 614 are shown which connect the frame 604 to y-axis anchor 610. The y-hinges 614 also deliver the ground and x-voltage to the frame as in previous detailed embodiments. Y-drive is performed through a pair of y-axis vertical comb drives 616, 617. The mirror 600 is connected to the frame through x-hinges 618,619. X-axis anchor 602 shown in FIG. 29A are used to connect the top mirror layer 600 to the x-hinges 618,619. Also shown are electrical control lines 624 and a lower electrode substrate 626. In operation, the top mirror layer 600 can rotate about the x-axis through hinges 618,619 when a voltage is applied to the x-axis electrode 606. Rotation in the y direction is achieved by applying a voltage across the y comb drives.

In the original MEMS design concept, a middle frame structure, comprised of two conductive layers separated by an insulating dielectric layer, was tilted in one axis (y-tilt) relative to a lower electrode substrate; and an upper mirror layer was tilted in a second, independent axis (x-tilt) relative to the frame.

For the previously detailed embodiments, the electrodes used to generate x-tilt traveled with the frame as it tilted in the y-axis—thereby de-coupling the x and y drive calibration so that each could be treated as independent. This continues to be the case for the embodiment of FIGS. 29A and 29B, with the exception that the frame structure is now comprised of a single layer and the isolation required to provide biased x-electrode regions is now achieved using isolation trenches. These trenches are cut all the way through the frame layer during an intermediate processing step (while the frame layer is still supported by a handle wafer, which will be subsequently removed) and then back-filled with an insulating dielectric to maintain mechanical integrity while proving the necessary electrical isolation.

In the previously detailed embodiments, the serpentine hinges which provide compliance for x and y tilt, where formed in the upper mirror layer and the middle frame layer, respectively. This has the advantage that the thickness of the x and y hinges can be chosen independently (since they are formed in separate layers during different processing steps) but necessitates tight process control for 2 fabrication steps (since the x and y hinges typically require the tightest dimensional control). The x-hinges also reduce the usable mirror surface area.

In the design of FIGS. 29A and 29B, the x and y hinges are both formed in the frame layer, during the same processing step. Both x and y hinges are also hidden under the mirror layer so that the usable mirror surface area is maximized.

In any of the designs described herein, the vertical comb drives, which are depicted for y-axis tilt, could be replaced by parallel-plate electrostatic drives. Similarly, the parallel-plate electrostatic drive depicted for x-axis tilt, could be replaced by a vertical comb drive. The x and y drives could therefore be any combination of parallel-plate electrostatic, vertical comb drive, or any other suitable drive mechanism such as electromagnetic, thermal bimorph, etc.

Figure 30:
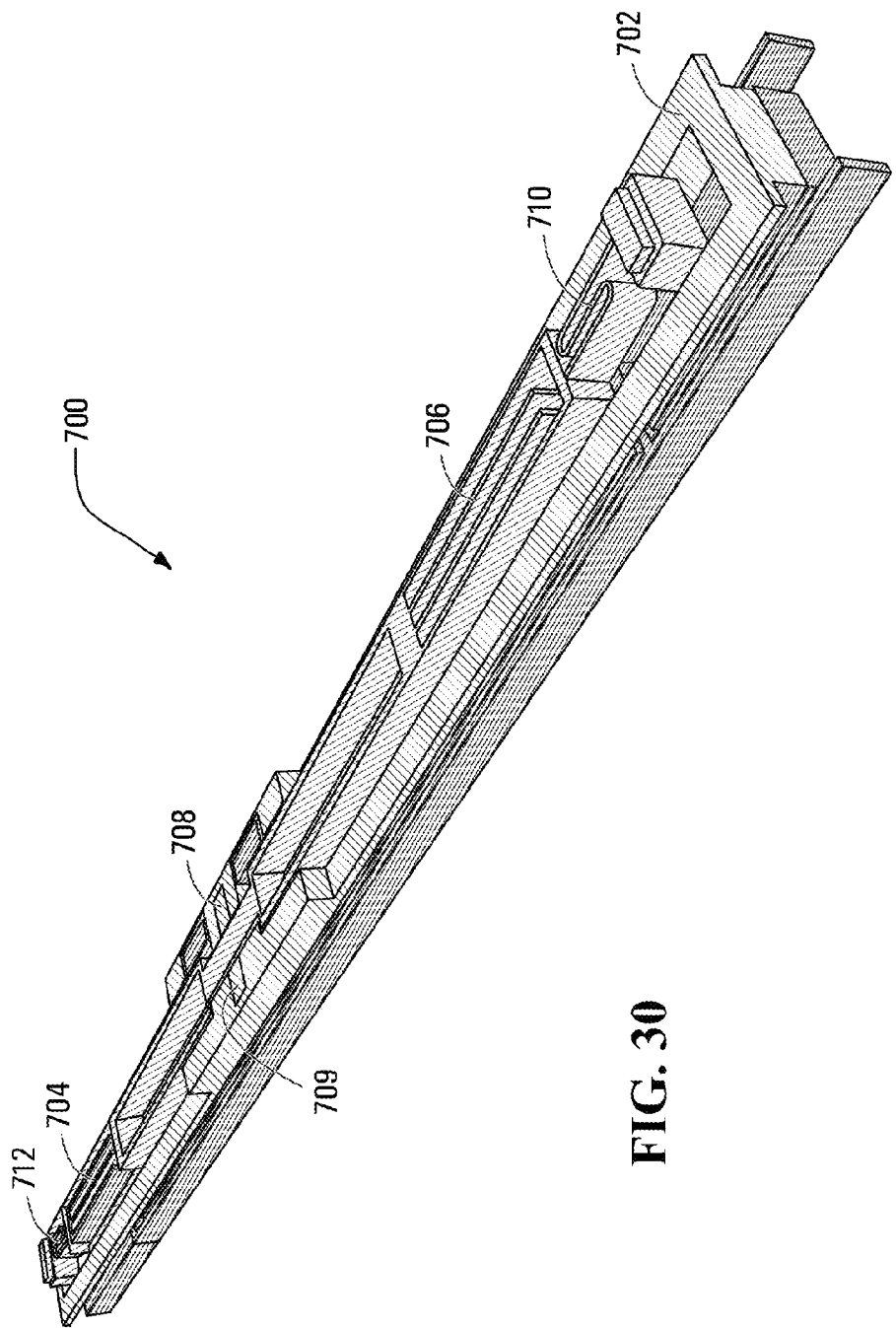
FIG. 30 is a perspective view of MEMS arrangement featuring electrical bias lines running along a substrate.

In any of the designs described herein, electrically grounded shields may be added to reduce effects of unwanted stray electromagnetic fields. For example, a grounded shield may be formed over the electrical control lines that route bias voltages to the x and y drives—thereby eliminating any electrostatic interaction between the routing lines and the suspended frame or mirror structures. This is illustrated in FIG. 30. In this example, the electrical bias lines run along the substrate as in previous embodiments, as indicated generally at 700. A stationary ground shield 702 is formed between the substrate upon which the bias lines are implemented and the frame. This shields signals propagating along the electrical bias lines 700 from effecting the operation of the x- and/or y-actuators. The stationary ground shields can be formed in the same layer used for the stand-offs. The example of FIG. 30 includes two y comb drives 704,706 that actuate rotation around y-hinges 708,709 and electrostatic plate actuation about the x-axis defined by the x-hinges 710,712. However, it is to be clearly understood that the inclusion of a stationary ground shield can be included with any of the embodiments described herein.

Numerous modifications and variations of the present invention are possible in light of the above teachings. It is therefore to be understood that within the scope of the appended claims, the invention may be practiced otherwise than as specifically described herein.

We claim:

1. A MEMS arrangement comprising:
a plurality of MEMS devices arranged in an array, each MEMS device of the plural MEMS devices being adjacent to at least an adjacent MEMS device, and each MEMS device comprising:
a substrate;
a first rotatable element;
a support structure anchored to a substrate;
at least one support element that supports the first rotatable element to the support structure so as to be rotatable with respect to the support structure in a first axis of rotation;
wherein a first support element of said at least one support element is configured to extend laterally to be at least partially within an outline of an adjacent MEMS device.

2. The MEMs arrangement of claim 1 wherein for at least one of the MEMs devices:
the first rotatable element is a support frame;
the MEMs device further comprises a second rotatable element that is supported by the support frame so as to be rotatable about a second axis of rotation.

3. The MEMs arrangement of claim 1 wherein:
the at least one support element comprises two flexible hinges that each extend laterally to be at least partially within an outline of an adjacent MEMS device.

4. The MEMS arrangement of claim 1, configured as a 1×N array with fill-factor >90%.

5. The MEMS arrangement of claim 2, wherein the rotation in the first axis of rotation is substantially independent of rotation in the second axis of rotation.

6. The MEMS arrangement of claim 5, wherein the two axes of rotation are substantially orthogonal.

7. The MEMS arrangement of claim 2, wherein the first support element is at least partially covered by the second rotatable element of the adjacent MEMS device.

8. The MEMS arrangement of claim 1, further comprising:
actuating electrodes disposed between the first rotatable element and the substrate;
wherein rotation about the first axis of rotation is achieved by the actuating electrodes;
wherein the actuating electrodes comprise at least one of parallel plate electrostatic actuators, vertical comb drives, electromagnetic actuators.

9. The MEMS arrangement of claim 2, further comprising:
actuating electrodes disposed between the support frame and the second rotatable element;
wherein rotation about the second axis of rotation is actuated by the actuating electrodes;
wherein the actuating electrodes comprise at least one of parallel plate electrostatic actuators, vertical comb drives, electromagnetic actuators.

10. The MEMS arrangement of claim 2, further comprising:
first actuating electrodes disposed between the support frame and the substrate;
wherein rotation about the first axis of rotation is actuated by the first actuating electrodes;
wherein the first actuating electrodes comprise at least one of parallel plate electrostatic actuators, vertical comb drives, electromagnetic actuators;
the arrangement further comprising:
second actuating electrodes disposed between the support frame and the second rotatable element;
wherein rotation about the second axis of rotation is actuated by the second actuating electrodes;
wherein the actuating electrodes comprise at least one of parallel plate electrostatic actuators, vertical comb drives, electromagnetic actuators.

11. The MEMS arrangement of claim 1, wherein:
the at least one support element comprises at least one flexible hinge providing rotation about the first axis of rotation.

12. The MEMS arrangement of claim 2, wherein:
the first support element comprises at least one flexible hinge providing rotation about the first axis.

13. The MEMS arrangement of claim 2, wherein:
at least one flexible hinge that supports the second rotatable element to the support frame so as to be rotatable about the second axis of rotation.

14. The MEMS arrangement of claim 13, wherein:
the support frame and the second rotatable element are collectively formed of an upper conductive layer and a lower conductive layer with regions separated by an insulating layer.

15. The MEMS arrangement of claim 14, wherein:
the at least one flexible hinge is formed at least partially in one of the conductive layers.

16. The MEMS arrangement of claim 13, wherein:
the support frame is formed of an upper conductive layer and a lower conductive layer separated by an insulating layer.

17. The MEMS arrangement of claim 16, wherein:
the at least one flexible hinge providing rotation about the first axis is formed at least partially in one of the conductive layers.

18. The MEMS arrangement of claim 1 wherein the arrangement other than the substrate is formed in a three layer structure.

19. The MEMS arrangement of claim 18 wherein the three layer structure comprises an upper conductive layer and a lower conductive layer separated by an insulating layer.

20. The MEMS arrangement of claim 19 wherein the at least one support element is formed at least partially in one of the conductive layers.

21. The MEMS arrangement of claim 20 wherein the at least one support element is formed in the upper conductive layer.

22. The MEMS arrangement of claim 21 wherein the at least one support element comprises at least one flexible hinge providing rotation about the first axis of rotation.

* * * * *